(12) United States Patent
Lee et al.

(10) Patent No.: US 12,408,423 B2
(45) Date of Patent: Sep. 2, 2025

(54) SEMICONDUCTOR DEVICES

(71) Applicant: Samsung Electronics Co., Ltd., Suwon-si (KR)

(72) Inventors: Junghan Lee, Anyang-si (KR); Taeyong Kwon, Suwon-si (KR); Minchul Sun, Yongin-si (KR); Byounggi Kim, Suwon-si (KR); Suhyeon Park, Bucheon-si (KR); Kihwan Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 371 days.

(21) Appl. No.: 17/856,157

(22) Filed: Jul. 1, 2022

(65) Prior Publication Data

US 2022/0336451 A1    Oct. 20, 2022

Related U.S. Application Data

(63) Continuation of application No. 16/855,321, filed on Apr. 22, 2020, now Pat. No. 11,410,997.

(30) Foreign Application Priority Data

Sep. 11, 2019    (KR) ........................ 10-2019-0112982

(51) Int. Cl.
  *H10D 84/83*    (2025.01)
  *H10D 30/01*    (2025.01)
  (Continued)

(52) U.S. Cl.
  CPC ......... *H10D 84/834* (2025.01); *H10D 30/024* (2025.01); *H10D 30/62* (2025.01);
  (Continued)

(58) Field of Classification Search
  CPC ............ H01L 29/41791; H01L 29/785; H01L 29/7855; H01L 27/0886; H01L 21/823431;
  (Continued)

(56) References Cited

U.S. PATENT DOCUMENTS 7,838,405 B2    11/2010  Lee
8,987,836 B2    3/2015   Kim et al.
(Continued)

FOREIGN PATENT DOCUMENTS

KR    20060130322 A    12/2006
KR    20110111680 A    10/2011

*Primary Examiner* — Tuan A Hoang
(74) *Attorney, Agent, or Firm* — Wolf, Greenfield & Sacks, P.C.

(57) ABSTRACT

A semiconductor device may include a substrate including first regions and a second region between the first regions. Active fins may protrude from the substrate in the first regions. Each of the active fins may extend in a first direction parallel to an upper surface of the substrate. The active fins may be regularly arranged and spaced apart from each other in a second direction. First trenches may be at both edges of the second region. A protrusion may be between the first trenches. An upper surface of the protrusion may be lower than a bottom of the active fins. A first width in the second direction of one of the first trenches may be greater than 0.7 times a first pitch of the active fins that is a sum of a width of one of the active fins and a distance between adjacent ones of the active fins.

19 Claims, 27 Drawing Sheets

(51) Int. Cl.
*H10D 30/62* (2025.01)
*H10D 84/01* (2025.01)
*H10D 84/03* (2025.01)

(52) U.S. Cl.
CPC ..... *H10D 84/0151* (2025.01); *H10D 84/0158* (2025.01); *H10D 84/038* (2025.01)

(58) Field of Classification Search
CPC ..... H01L 21/823481; H01L 21/823878; H01L 21/76224
See application file for complete search history.

(56) References Cited

U.S. PATENT DOCUMENTS

| | | | |
|---|---|---|---|
| 9,362,176 B2 | 6/2016 | Yu et al. | |
| 9,837,282 B1 | 12/2017 | Weng et al. | |
| 9,899,526 B2 | 2/2018 | Chiu et al. | |
| 9,985,043 B2 | 5/2018 | Tsuda | |
| 10,147,805 B2 | 12/2018 | Chen et al. | |
| 2014/0225065 A1 | 8/2014 | Rachmady et al. | |
| 2015/0069528 A1* | 3/2015 | Chiang | H01L 21/3085 438/700 |
| 2015/0137308 A1* | 5/2015 | Akarvardar | H01L 21/76229 438/424 |
| 2018/0033740 A1 | 2/2018 | Kuan et al. | |
| 2018/0040713 A1 | 2/2018 | Chang et al. | |
| 2018/0090491 A1 | 3/2018 | Huang et al. | |
| 2018/0144988 A1 | 5/2018 | Liou et al. | |
| 2018/0337251 A1 | 11/2018 | Chang et al. | |
| 2019/0096766 A1 | 3/2019 | Chiang et al. | |
| 2019/0148520 A1* | 5/2019 | Chang | H10D 84/038 257/192 |
| 2020/0243537 A1* | 7/2020 | Li | H01G 4/012 |

* cited by examiner

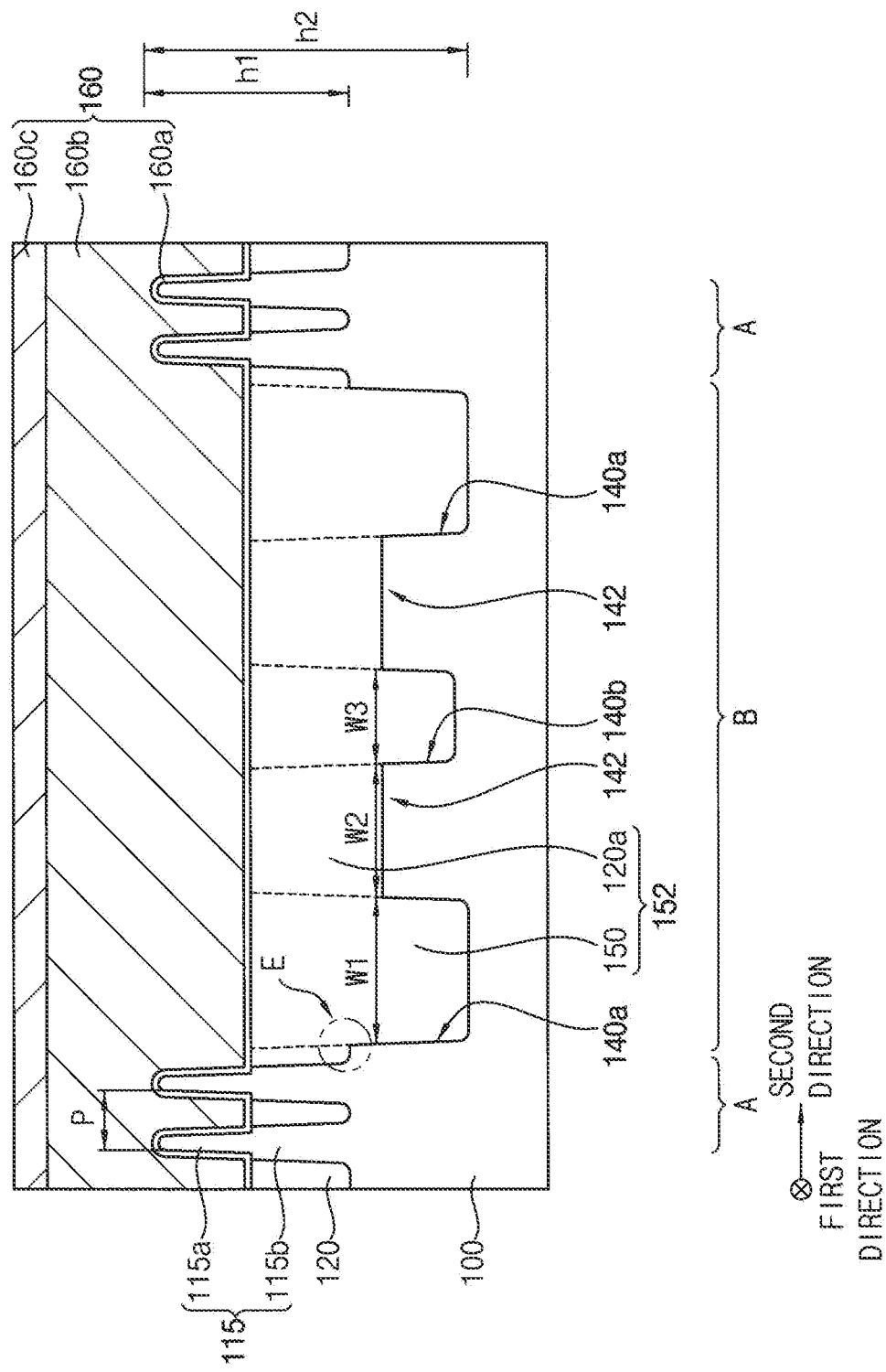

FIG. 26
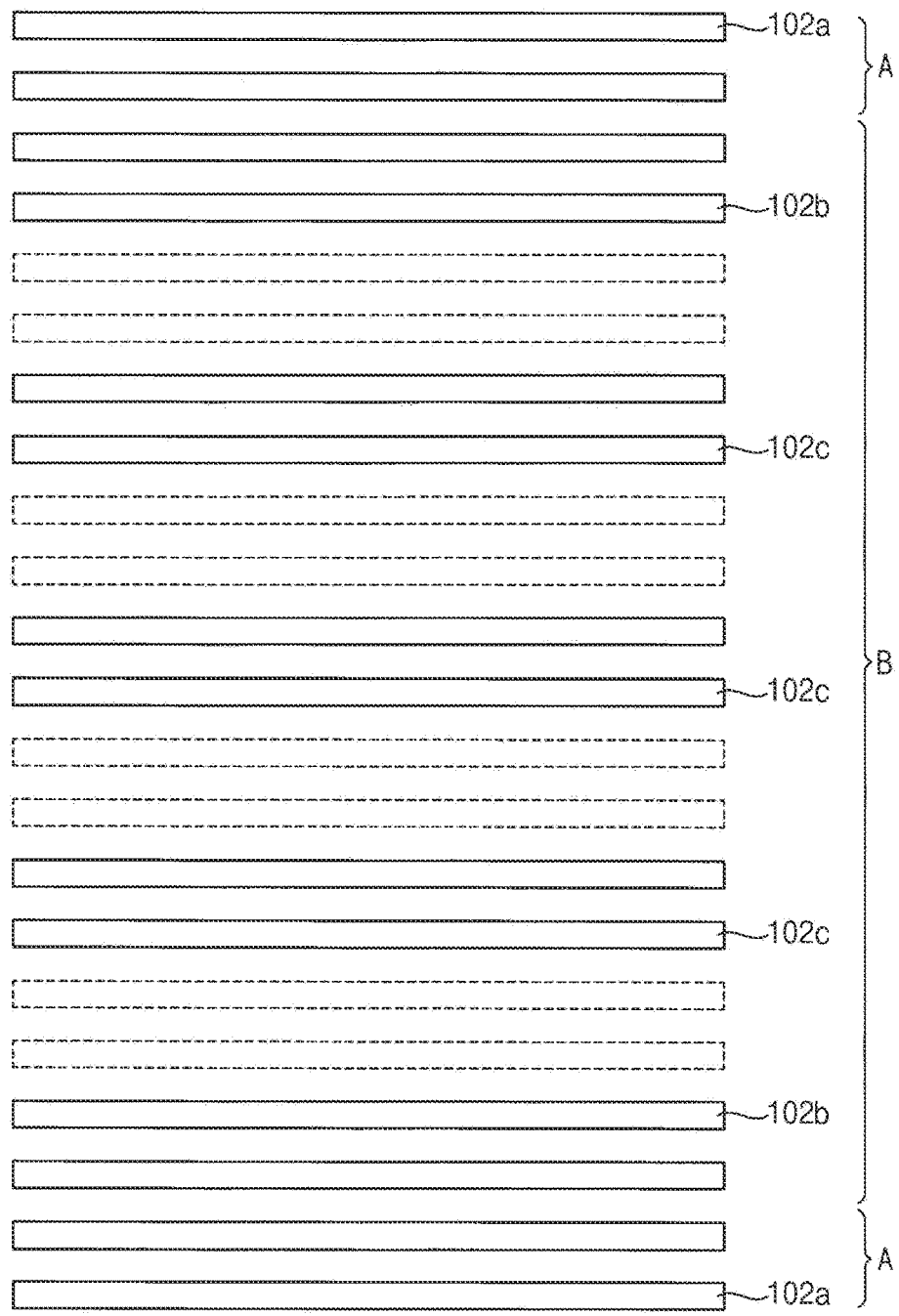
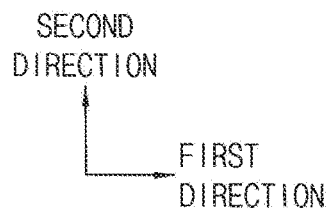

SEMICONDUCTOR DEVICES

CROSS-REFERENCE TO RELATED APPLICATIONS

This patent application is a continuation of U.S. patent application Ser. No. 16/855,321 filed Apr. 22, 2020, which claims the benefit under 35 USC § 119(a) of Korean Patent Application No. 10-2019-0112982, filed on Sep. 11, 2019, in the Korean Intellectual Property Office (KIPO), and the entire contents of each above-identified application are incorporated by reference herein.

BACKGROUND

1. Field

Example embodiments relate to semiconductor devices. More particularly, example embodiments relate to semiconductor devices including fin field-effect transistors (finFETs).

2. Description of the Related Art

A semiconductor device may include a first region in which finFETs are formed and a second region in which the finFETs are not formed. Active fins may be repeatedly disposed in the first region. The active fins formed in the second region may be removed, so that the active fins may not be disposed in the second region. However, some of the active fins may not be removed and may remain in the second region, and thus defects caused by the remaining active fins may occur.

SUMMARY

Example embodiments provide semiconductor devices having excellent characteristics.

According to example embodiments, there is provided a semiconductor device that may include a substrate including first regions and a second region between the first regions. Active fins may protrude from the substrate in the first regions. Each of the active fins may extend in a first direction that is parallel to an upper surface of the substrate. The active fins may be regularly arranged and may be spaced apart from each other in a second direction that is parallel to the upper surface of the substrate and perpendicular to the first direction. First trenches may be at both edges in the second direction of the second region. A protrusion may be between the first trenches. An upper surface of the protrusion may be lower than a bottom of each of the active fins. A first width in the second direction of one of the first trenches may be greater than 0.7 times a first pitch of the active fins that is a sum of a width of one of the active fins and a distance between adjacent ones of the active fins.

According to example embodiments, there is provided a semiconductor device that may include a substrate including first regions and a second region between the first regions. Active fins may protrude from the substrate in the first regions. Each of the active fins may extend in a first direction that is parallel to an upper surface of the substrate. The active fins may be regularly arranged, and may be spaced apart from each other in a second direction that is parallel to the upper surface of the substrate and perpendicular to the first direction. Each of the active fins includes a lower active fin and an upper active fin on the lower active fin. First trenches may be at both edges in the second direction of the second region, and a protrusion may be between the first trenches. A first isolation pattern may be in a gap between the lower active fins. An isolation structure may include a second isolation pattern in one of the first trenches and a third isolation pattern on the protrusion. A gate structure may extend in the second direction on the active fins, the first isolation pattern, and the isolation structure. An upper surface of the protrusion and a bottom of the first trench are lower than a bottom of one of the active fins.

According to example embodiments, there is provided a semiconductor device that may include a substrate including first regions and a second region between the first regions. Active fins may protrude from the substrate in the first regions. Each of the active fins may extend in a first direction that is parallel to an upper surface of the substrate. The active fins may be regularly arranged, and may be spaced apart from each other in a second direction that is parallel to the upper surface of the substrate and perpendicular to the first direction. First trenches may be at both edges in the second direction of the second region. Protrusions may be between the first trenches. A first active fin of the active fins may be at an edge portion among the active fins in the second direction among the active fins. An end portion of the first active fin extending laterally from a lower portion of the first active fin may be connected to a sidewall of the first trench. The end portion of the first active fin and the sidewall of the first trench may have a non-linear shape.

In the semiconductor device in accordance with example embodiments, the first trench and the protrusion may be formed in the second region, and active fins may not remain in the second region. Therefore, defects caused by remaining active patterns in the second region may decrease.

BRIEF DESCRIPTION OF THE DRAWINGS

Example embodiments will be more clearly understood from the following detailed description taken in conjunction with the accompanying drawings. FIGS. 1 to 26 represent non-limiting, example embodiments as described herein.

FIGS. 1, 2A, and 2B are a plan view and cross-sectional views illustrating a vertical semiconductor device in accordance with example embodiments.

FIGS. 3 and 4 are respective cross-sectional views illustrating vertical semiconductor devices in accordance with example embodiments.

FIGS. 5 to 17 are cross-sectional views and plan views illustrating stages of a method of manufacturing a semiconductor device in accordance with example embodiments.

FIGS. 18 and 19 are a plan view and a cross-sectional view illustrating a semiconductor device in accordance with example embodiments.

FIGS. 20 and 21 are a plan view and a cross-sectional view illustrating stages of a method of manufacturing a semiconductor device in accordance with example embodiments.

FIG. 22 is a cross-sectional view illustrating a semiconductor device in accordance with example embodiments.

FIGS. 23 to 25 are cross-sectional views illustrating semiconductor devices in accordance with example embodiments.

FIG. 26 is a plan view illustrating a method of manufacturing a semiconductor device in accordance with example embodiments.

DETAILED DESCRIPTION OF EMBODIMENTS

Hereinafter, two directions substantially parallel to an upper surface of the substrate and crossing each other are defined as a first direction and a second direction, respectively. A direction substantially perpendicular to the upper surface of the substrate is defined as a vertical direction. The first and second directions are substantially perpendicular to each other. It will be understood that, although the terms first, second, third, etc. may be used herein to describe various elements, the elements should not be limited by these terms; rather, these terms are only used to distinguish one element from another element. Thus, a first element discussed could be termed a second element without departing from the scope of the present inventive concepts.

Figure 1:
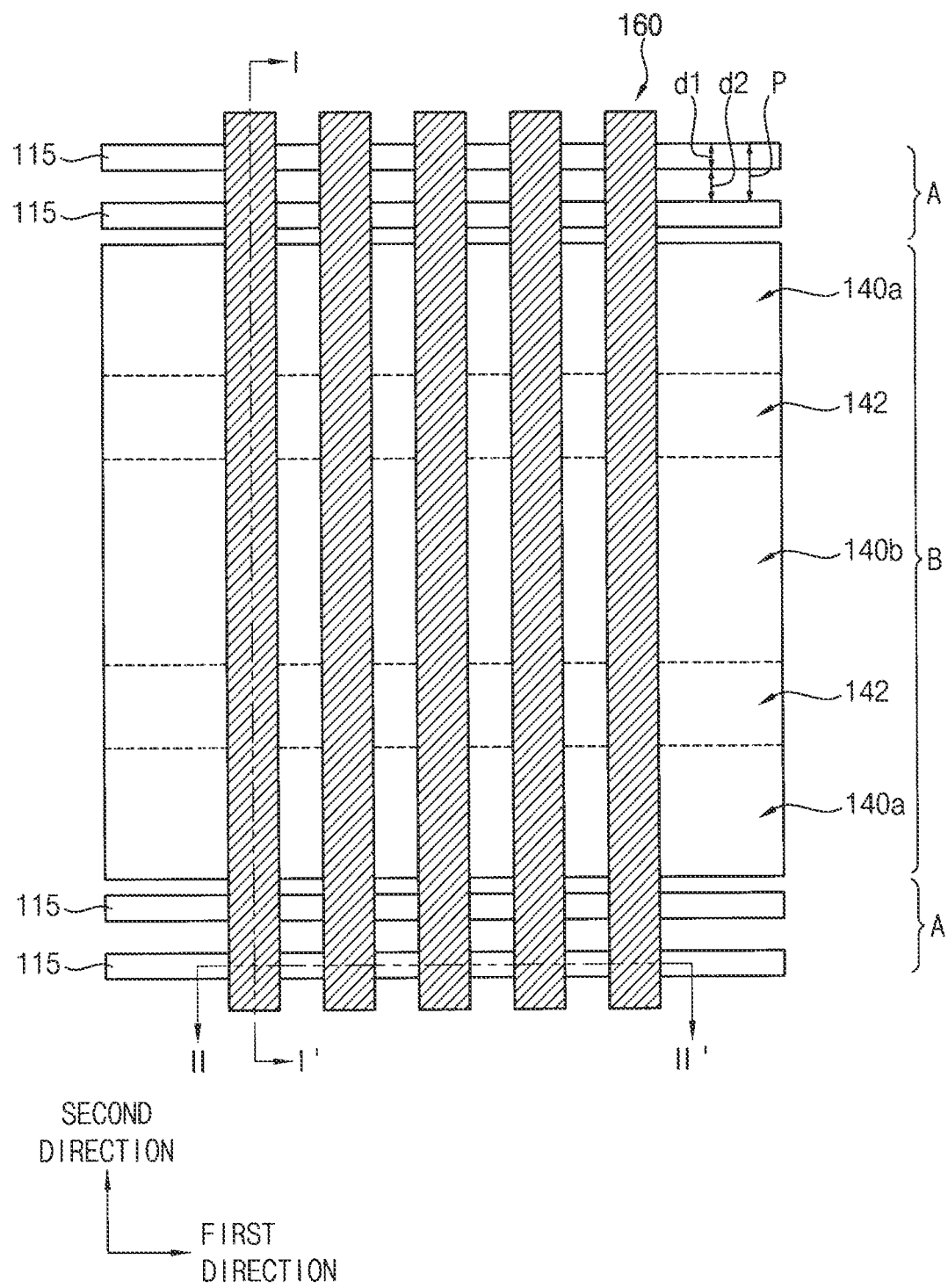
Figure 2A:
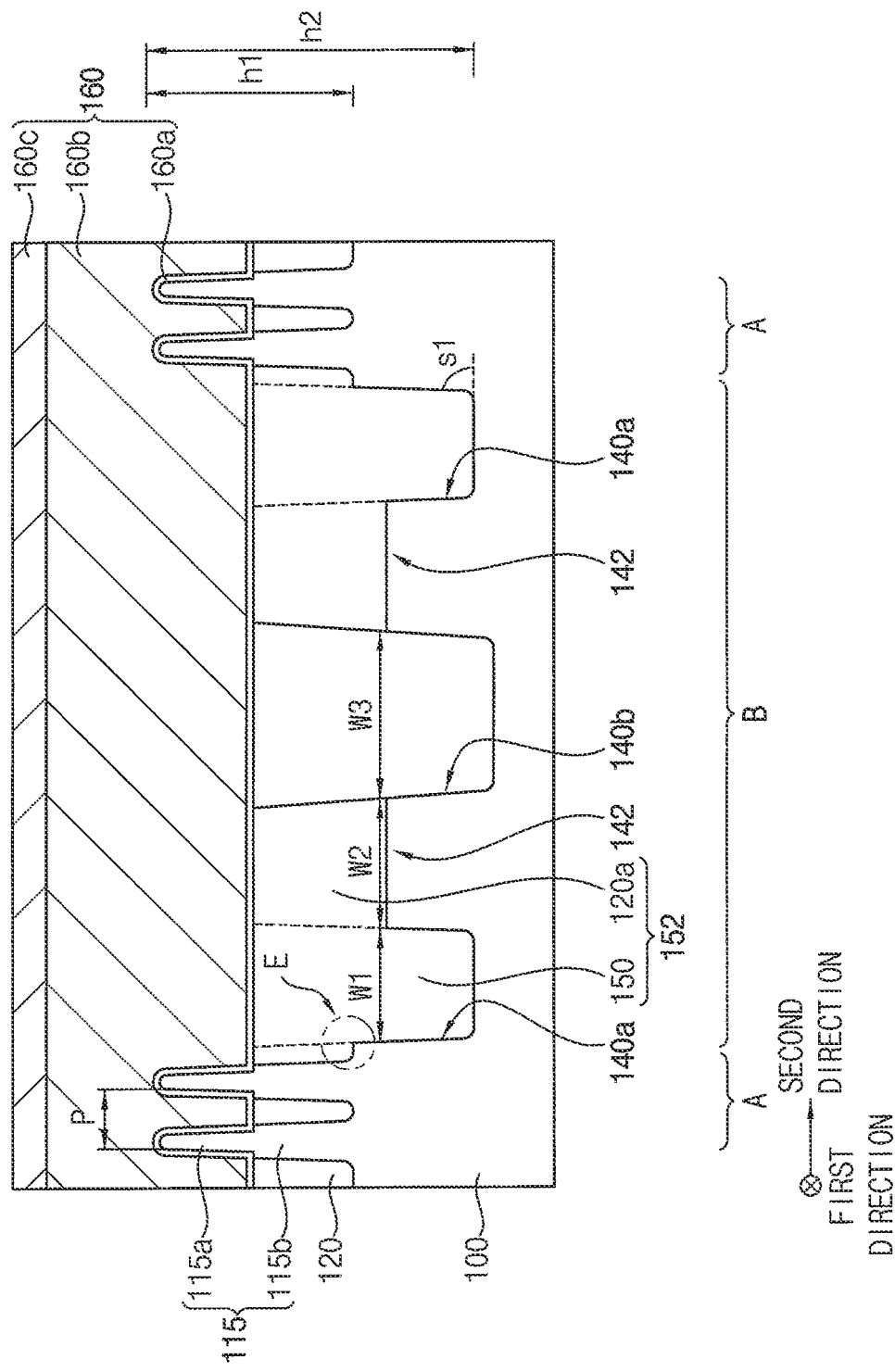
Figure 2B:
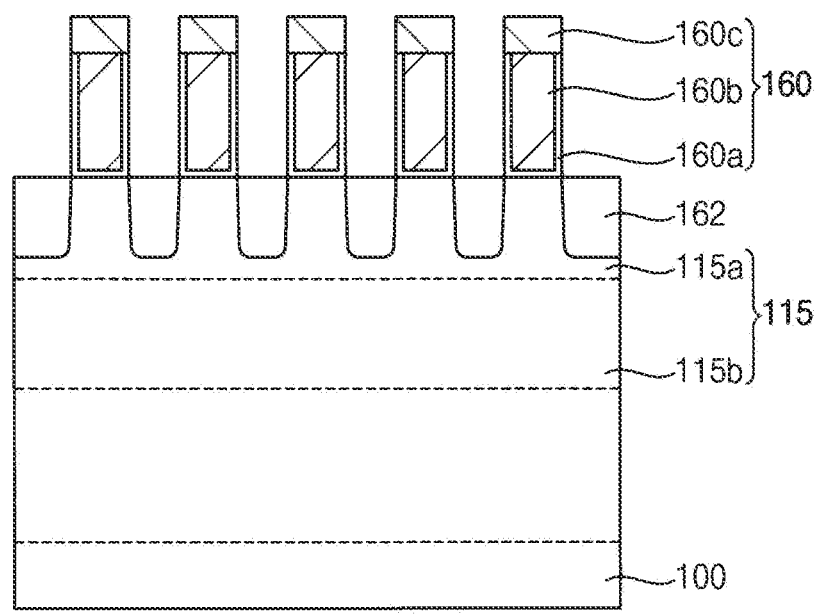
Figure 4:
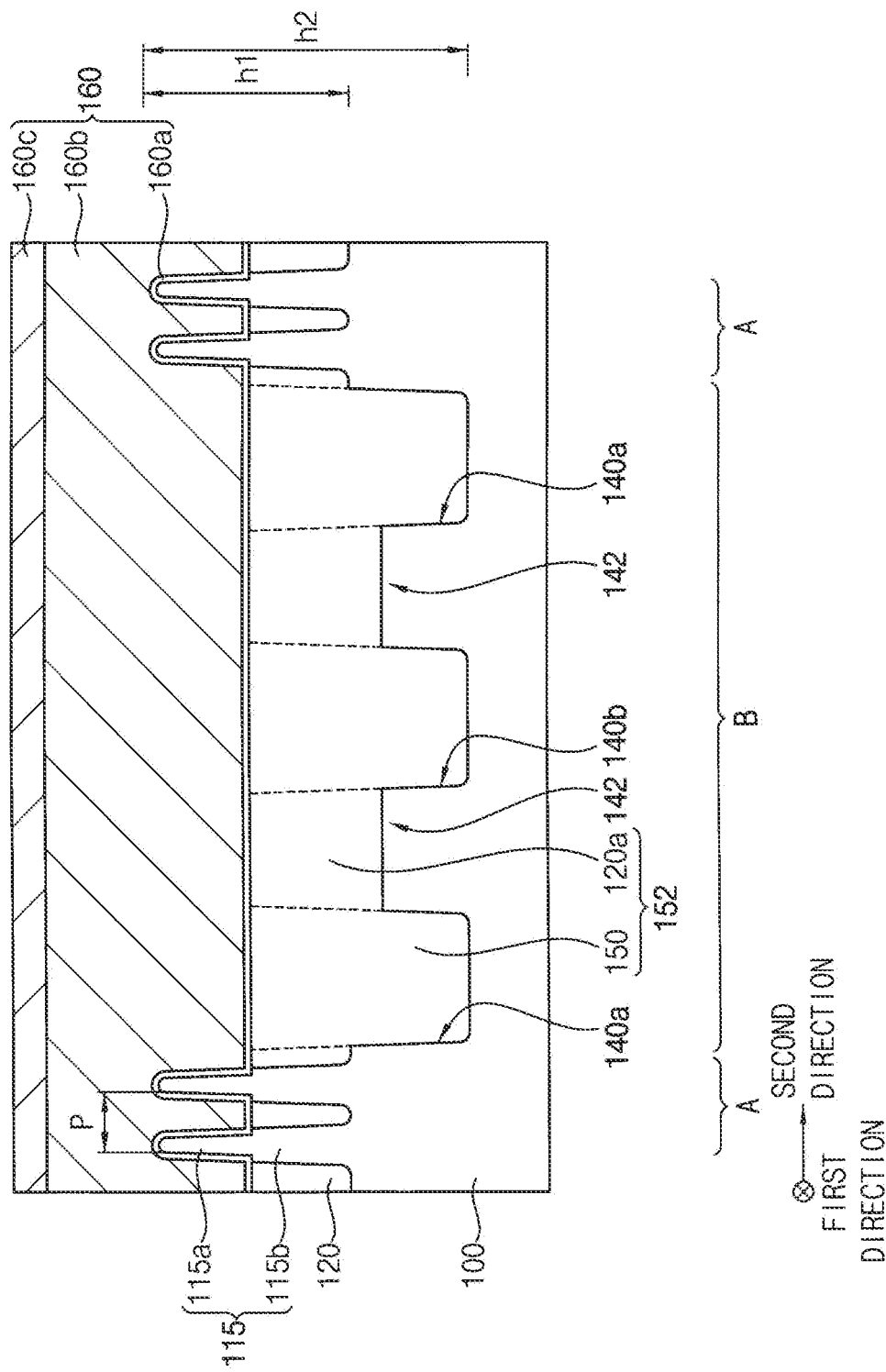

FIGS. 1, 2A, and 2B are a plan view and cross-sectional views illustrating a semiconductor device in accordance with example embodiments. FIGS. 3 and 4 are respective cross-sectional views illustrating semiconductor devices in accordance with example embodiments.

Particularly, FIG. 2A is a cross-sectional view taken along the line I-I' of FIG. 1. FIG. 2B is a cross-sectional view taken along the line II-II' of FIG. 1. The semiconductor devices shown in FIGS. 3 and 4 are substantially the same as a semiconductor device shown in FIGS. 1, 2A, and 2B, except with respect to a shape of a trench formed in the second region.

Referring to FIGS. 1, 2A, and 2B, a substrate may include first regions A in which finFETs are formed and a second region B in which the finFETs are not formed. The second region B may be disposed between the first regions A. The second region B may serve as a device isolation region.

The substrate 100 may include a semiconductor material such as silicon, germanium, or silicon-germanium, or a group III-V compound such as GaP, GaAs, GaSb, or the like. In example embodiments, the substrate 100 may be a silicon-on-insulator (SOI) substrate or a germanium-on-insulator (GOI) substrate.

Active fins 115 protruding from a surface of the substrate 100 may be formed in the first region A. A first gap may be formed between the active fins 115.

The active fins 115 may extend in the first direction, and the active fins 115 may be regularly arranged in the second direction.

Hereinafter, when same patterns are regularly arranged, a sum of a width of one of the same patterns and a distance between the same patterns is defined as a pitch. In example embodiments, the active fins 115 may be disposed such that the sum of a width d1 of one of the active fins and a distance d2 between the active fins has a first pitch P. Hereinafter, the width may be a width in the second direction.

In an example embodiment, when the first pitch P of the active fins 115 may be relatively narrow and a width of the device isolation region B may be relatively wide and/or large, a suitable isolation structure may be provided. In example embodiments, the first pitch P may be about 40 nm or less. For example, the first pitch P may be about 10 nm to about 30 nm.

The first isolation pattern 120 may be in and/or fill a lower portion of the first gap. It will be understood that "an element A fills an element B" (or similar language) as used herein means that the element A is in the element B but does not necessarily mean that the element A fills the element B entirely. Thus, the active fin 115 may include a lower active fin 115b covered by the first isolation pattern 120 and an upper active fin 115a not covered by the first isolation pattern 120 (e.g., the first isolation pattern 120 is not on the upper active fin 115a). In example embodiments, a width (e.g., in the second direction) of the upper active fin 115a may be less than a width of the lower active fin 115b. For example, the first isolation pattern 120 may include an oxide such as silicon oxide.

A height from an upper surface of the active fin 115 to a bottom of the first gap is referred to as a first height h1.

Trenches may be formed at both side edges in the second direction of the second region of the substrate. The trench and a protrusion may be alternately and repeatedly disposed in the second region.

In example embodiments, two first trenches 140a, one second trench 140b, and two protrusions 142 may be formed in the second region B. For forming one of the trenches, a width of at least the first pitch P may be needed. Also, for forming one of the protrusions, a width of at least the first pitch P may be needed. Thus, in this case, a width of the second region B may be greater than at least five times the first pitch P.

The first trenches 140a may be formed at both side edges of the second region B that are adjacent to the first region A, respectively. Further, the second trench 140b may be formed between the first trenches 140a.

Protrusions 142 may be formed between (e.g., in the second direction) the first and second trenches 140a and 140b, respectively. An upper surface of the protrusion 142 may be substantially flat. The second trench 140b may be disposed between (e.g., in the second direction) the protrusions 142.

The protrusion 142 may be formed at a portion where at least one preliminary first mask pattern that served as an etching mask for forming the active fin 115 is removed. If one preliminary first mask pattern is removed, the width W2 of the protrusion 142 may be similar to the first pitch P. Particularly, the width W2 of the protrusion 142 may be about 0.7 times to about 1.0 times the first pitch P in consideration of a slope of the protrusion 142 and process deviations. Thus, the width W2 of the protrusion 142 may be greater than 0.7 times the first pitch P.

In example embodiments, the width W2 of the protrusion 142 may vary depending on the number of preliminary first mask patterns to be removed. In order to stabilize manufacturing process, at least two preliminary first mask patterns may be removed. Thus, preferably, the width W2 of the protrusion 142 may be greater than the first pitch P.

In example embodiments, an upper surface of the protrusion 142 may be lower than a bottom of the first gap between the active fins 115. If the upper surface of the protrusion 142 is higher than the bottom of the first gap between the active fins 115, a device isolation characteristic may deteriorate.

Hereinafter, the active fin 115 disposed at the edge in the second direction of the first region A is referred to as a first active fin. An end portion E extending laterally from the lower portion of the first active fin (e.g., towards the second region B) is referred to as an end portion of the first active fin. The end portion E of the first active fin may be connected to the sidewall of the first trench 140a.

The bottom of the first trench 140a may be lower than the upper surface of the protrusion 142. Therefore, the bottom of the first trench 140a may be lower than the bottom of the first gap. Also, the end portion E of the first active fin and the sidewall of the first trench 140a may have a bent shape (e.g., a non-linear and/or curved shape).

Hereinafter, an angle between a sidewall of a trench and a line parallel to a flat bottom of the trench may be referred to as a sidewall slope. FIG. 2A illustrates an example sidewall slope s1 for a sidewall of a first trench 140a.

In example embodiments, the sidewall slope of the first trench 140a may be about 85° to about 90°. If the sidewall slope of the first trench 140a is less than 85°, a defect in which the second active pattern is not removed at the edge portion in the second direction of the second region B may be generated. Preferably, the sidewall slope of the first trench 140a may be about 87° to about 90°.

The sidewall slope of the first trench 140a may vary depending on the width of the first trench 140a. For example, as the width of the first trench 140a increases, the sidewall slope of the first trench 140a may be gentle (e.g., less vertical). Therefore, the width of the first trench 140a may be controlled so that the sidewall slope of the first trench 140a may be about 85° to about 90°.

In example embodiments, the width W1 of the first trench 140a may be greater than 0.7 times the first pitch P and less than 20 times the first pitch P. For example, the width W1 of the first trench 140a may be in a range of about 10 nm to about 500 nm. In this case, the width W1 of the first trench 140a may vary depending on a position of the sidewall of the protrusion 142 serving as one sidewall of the first trench 140a.

When the width of the first trench 140a is 500 nm or less, the sidewall slope of the first trench 140a may be about 85° to about 90°, and a variation of the sidewall slope due to an etch loading may not be large. However, if the width of the first trench 140a is greater than 20 times the first pitch or is greater than 500 nm, the sidewall slope of the first trench 140a may be smaller than about 85°.

The first trench 140a may be formed by removing at least one second active pattern formed at an edge in the second direction of the second region B. For example, when the first trench is formed by removing one second active pattern, the width of the first trench 140a may be similar to the first pitch P. The width of the first trench 140a may be greater than 0.7 times the first pitch P in consideration of a slope of the first trench 140a and process deviation. Thus, the width of the first trench 140a may be greater than 0.7 times the first pitch P. The width W1 of the first trench 140a may vary depending on the number of second active patterns to be removed.

The second trench 140b may not be adjacent to the first region A, and the second trench 140b may be spaced apart from the first region A. Therefore, the sidewall slope and the width W3 of the second trench 140b may not affect the device isolation characteristic. Thus, an allowable range of the sidewall slope of the second trench 140b may be greater than the range of the sidewall slope of the first trench 140a. For example, preferably, the sidewall slope of the second trench 140b may be about 80° to about 90°. However, the sidewall slope of the second trench 140b is not limited thereto, and the sidewall slope of the second trench may be lower than about 80°.

The second trench 140b may be formed by removing at least one second active pattern in the second region B. Therefore, the width of the second trench 140b may be greater than 0.7 times the first pitch P.

As the width W3 of the second trench 140b is increased, the sidewall slope of the second trench 140b may be gentle (e.g., less vertical).

In example embodiments, as shown in FIG. 2A, the width W3 of the second trench 140b may be greater than the width W1 of the first trench 140a. In this case, the sidewall slope of the second trench 140b may be gentler than the sidewall slope of the first trench 140a. Therefore, slopes of both sidewalls in the first direction of the protrusion 142 may not be the same to each other.

On the other hand, as the width of the second trench 140b is increased, an etching rate may be increased and a bottom of the second trench 140b may be lowered. Thus, the bottom of the second trench 140b may be lower than the bottom of the first trench 140a.

In some example embodiments, as shown in FIG. 3, the width W3 of the second trench 140b may be smaller than the width W1 of the first trench 140a. In this case, the sidewall slope of the second trench 140b may be greater than the sidewall slope of the first trench 140a. Thus, the slopes of both sidewalls of the protrusion 142 in the first direction may not be the same to each other. In some example embodiments, sidewall slopes of the first and second trenches 140a and 140b may be approximately equal. In some example embodiments, the bottom of the second trench 140b may be coplanar with the bottom of the first trench 140a, or the bottom of the second trench 140b may be higher than the bottom of the first trench 140a.

In some example embodiments, as shown in FIG. 4, the width W3 of the second trench 140b may be substantially the same as the width W1 of the first trench 140a. In this case, sidewall slopes of the first and second trenches 140a and 140b may be substantially the same. In addition, bottoms of the second trench 140b and the first trench 140a may be substantially coplanar with each other.

In example embodiments, a height h2 from a top surface of the active fin 115 to the bottom of the first trench 140a may be greater than 130% of the first height h1. Thus, the device isolation characteristic in the second region B may be improved.

In example embodiments, the protrusion 142 and the first trench 140a in the second region B may be symmetric with respect to a line extending in the first direction through a center (e.g., in the second direction) of the second region B.

An isolation structure 152 including a second isolation pattern 120a and a third isolation pattern 150 may be formed on the substrate 100 of the second region B. The second and third isolation patterns 120a and 150 may include an oxide such as silicon oxide. The second isolation pattern 120a and the third isolation pattern 150 may include substantially the same material, and thus the second isolation pattern 120a and the third isolation pattern 150 may be merged with each other.

The isolation structure 152 may fill the first and second trenches 140a and 140b, and the isolation structure 152 may be on and/or cover the upper surface of the protrusion 142. An upper surface of the isolation structure 152 may be coplanar with an upper surface of the first isolation pattern 120 formed in the first region A.

FinFETs may be formed on the first to third isolation patterns 120, 120a and 150 and the upper active fin 115a. The finFET formed in the first region A may be capable of being operated.

The finFET may include a gate structure 160 extending in the second direction and a source/drain layer 162 adjacent to both sides of the gate structure 160. The gate structure 160 may include a gate insulation layer 160a, a gate electrode 160b, and a hard mask pattern 160c.

In example embodiments, the gate insulation layer 160a may include a metal oxide having a dielectric constant higher than a dielectric constant of silicon oxide. For example, the gate insulation layer 160a may include an interface pattern and a high dielectric pattern. The gate electrode 160b may include a threshold voltage control pattern and a conductive pattern. The conductive pattern may include a metal.

A plurality of the gate structures 160 may be arranged in the first direction. A first insulating interlayer (not shown) may fill a portion between the gate structures.

A second insulating interlayer (not shown) may be formed on the gate structure 160 and the first insulating interlayer. A first contact plug (not shown) may contact an upper surface of the source/drain layer 162 through the first and second insulating interlayers.

In addition, the semiconductor device may further include a second contact plug contacting the gate electrode 160b and a wiring electrically connected to the first contact plug and the second contact plug.

As described above, the first trench 140a may be formed in the second region adjacent to the first active fin formed at the edge in the second direction of the first region A. The first trench 140a may have the width greater than 0.7 times the first pitch P and less than 20 times the first pitch P. The width of the first trench 140a may be in a range of about 10 nm to about 500 nm. As the width of the first trench 140a is controlled, the sidewall slope of the first trench 140a may be about 85° to about 90°. Therefore, the active patterns formed in the second region B adjacent to the first region A may be removed without leaving any active patterns remaining. Thus, defects caused by remaining active patterns in the second region may be decreased.

FIGS. 5 to 17 are cross-sectional views and plan views illustrating stages of a method of manufacturing a semiconductor device in accordance with example embodiments.

Particularly, FIGS. 5, 7, 9, 12, 14, and 16 are plan views, and FIGS. 6, 8, 10, 11, 13, 15, and 17 are cross-sectional views. In this case, each of cross-sectional views is a cross-sectional view of I-I' of each of the plan views.

Figure 5:
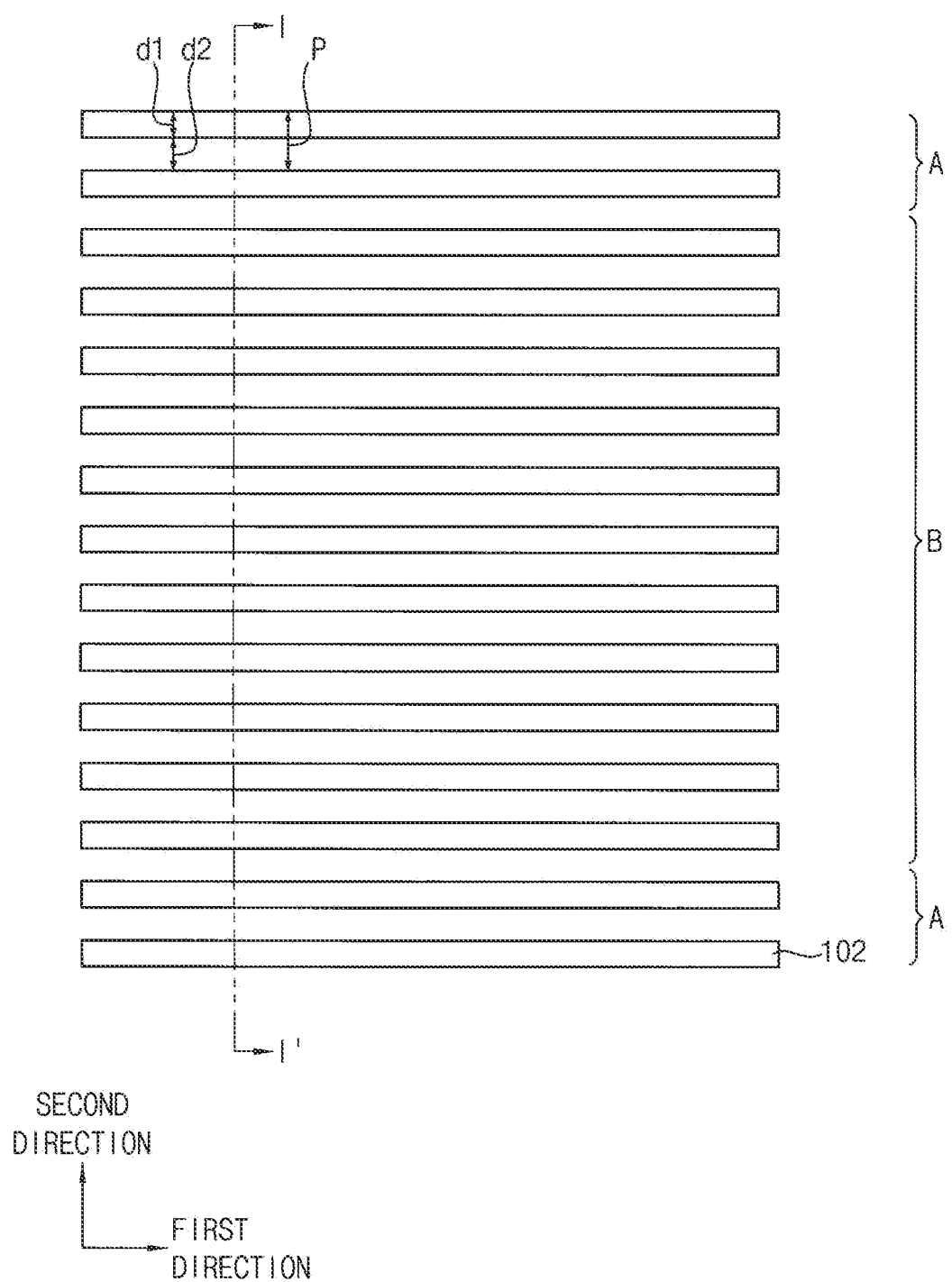
Figure 6:
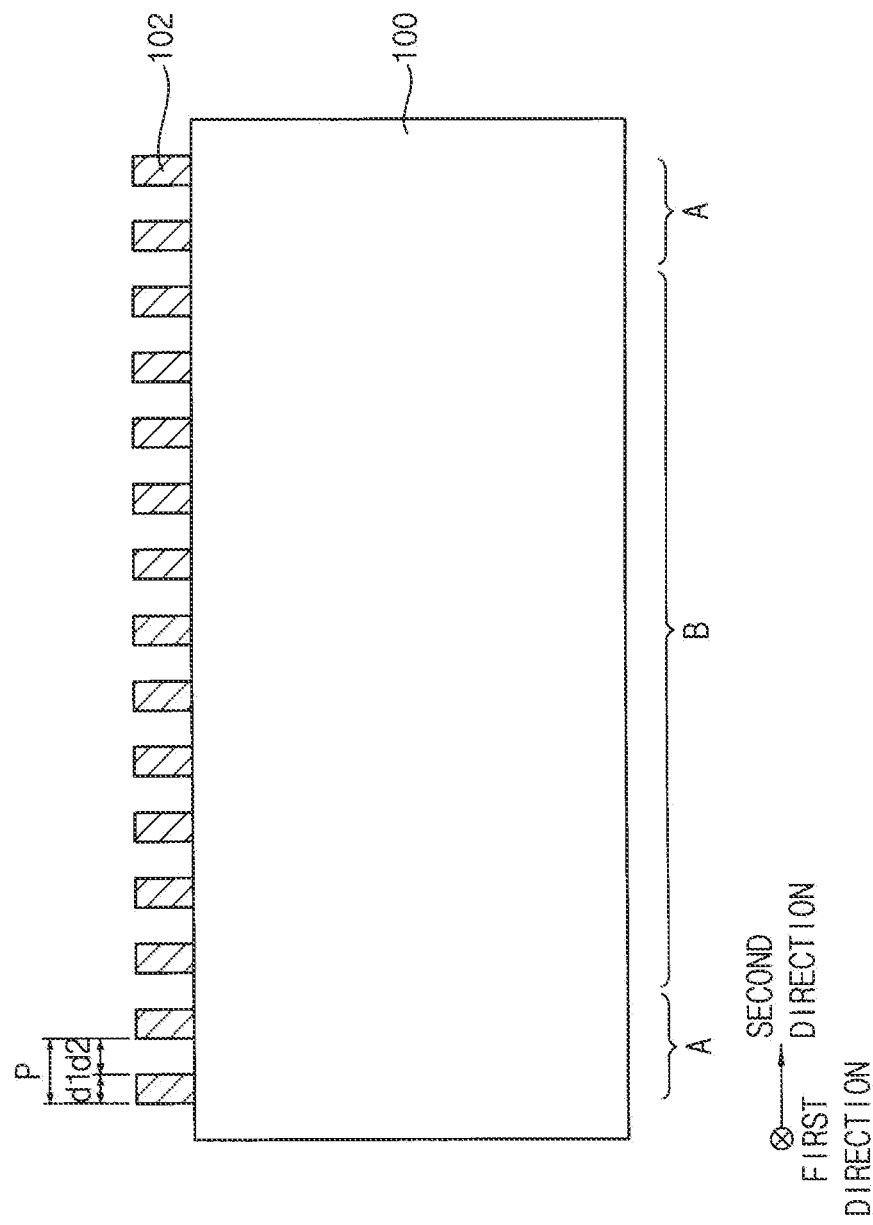

Referring to FIGS. 5 and 6, preliminary first mask patterns 102 for forming active fins may be formed on a substrate including a first region A and a second region B.

The preliminary first mask patterns 102 may extend in the first direction, and a plurality of preliminary first mask patterns 102 may be spaced apart from each other by a first distance d2 in the second direction. The preliminary first mask patterns 102 may each have a first width d1. The preliminary first mask patterns may be arranged to have a first pitch P that is a sum of the first width d1 and the first distance d2, and the first pitch P may be constant.

In example embodiments, the preliminary first mask pattern 102 may be formed by a double patterning process or a quadro patterning process.

Figure 7:
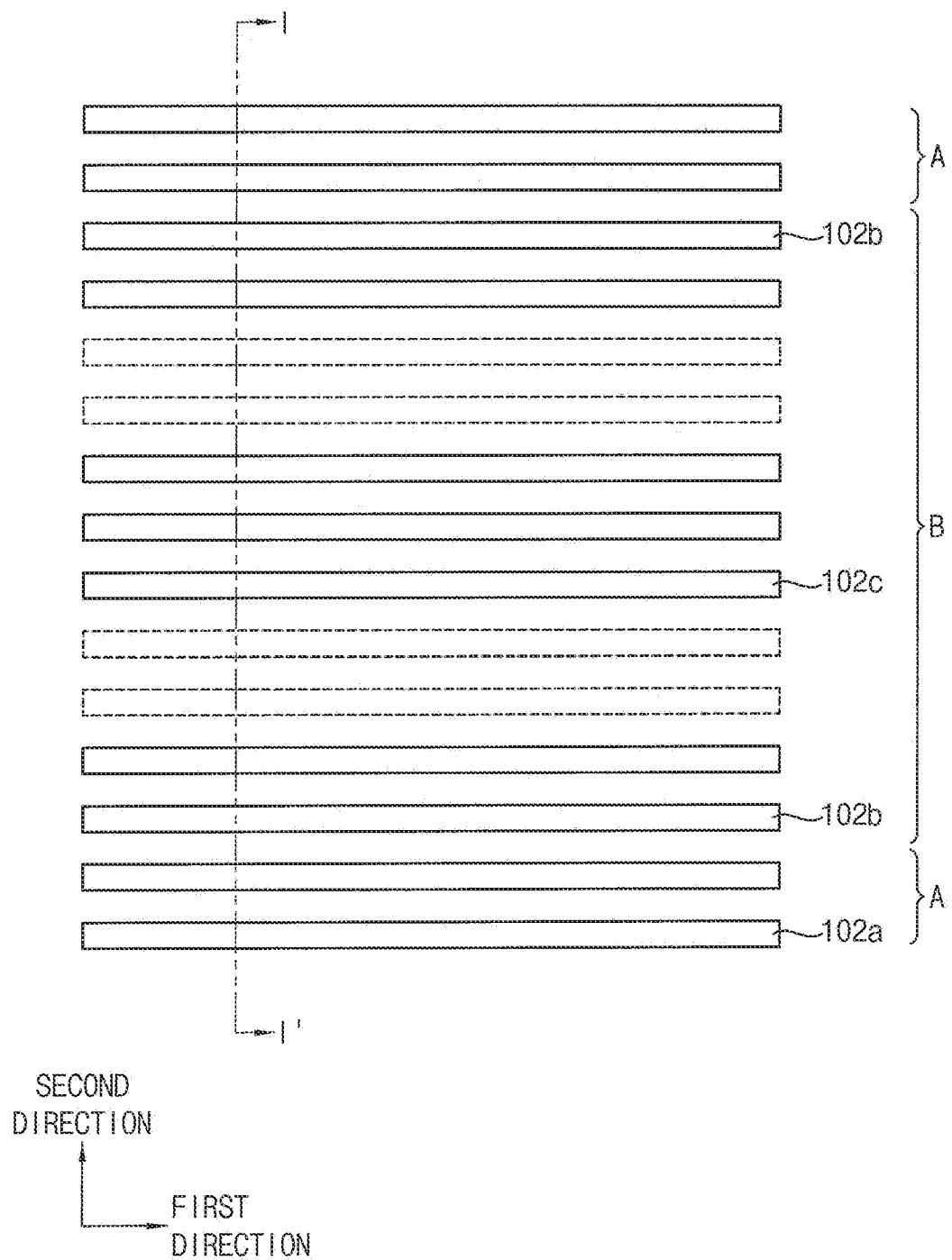
Figure 8:
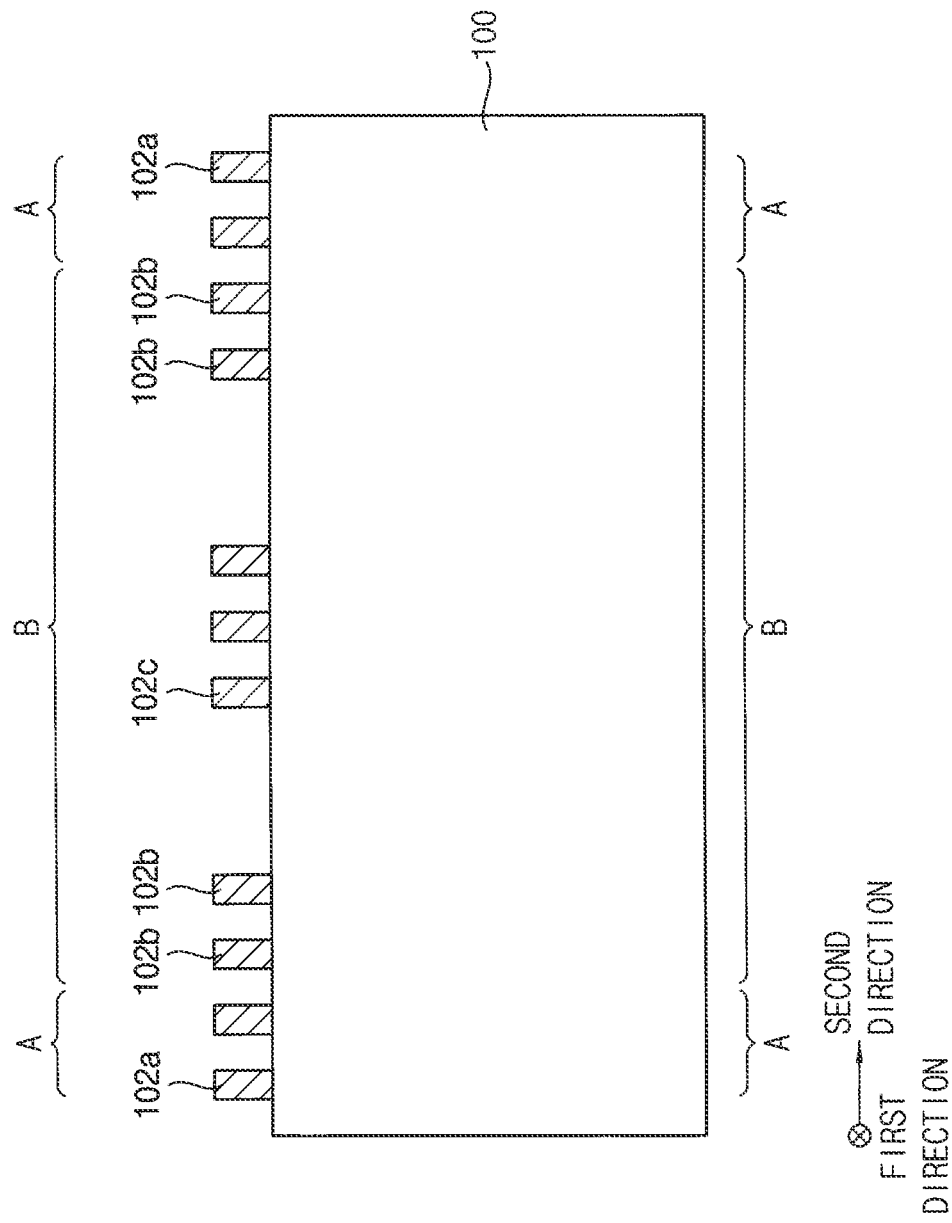

Referring to FIGS. 7 and 8, a subset of the preliminary first mask patterns 102 formed in the second region B may be removed to form a first mask pattern 102a in the first region A and second and third mask patterns 102b and 102c in second region B. In FIG. 7, the dotted line may represent removed preliminary first hard mask patterns 102.

In the removing process, the preliminary first mask patterns 102 formed in the first region A may not be removed.

In the removing process, at least one preliminary first mask pattern 102 disposed at both edges in the second direction of the second region B may not be removed. Therefore, the preliminary first mask pattern 102 remaining at the both edges in the second direction of the second region B may serve as the second mask pattern 102b.

A portion of the second region B including the second mask pattern 102b may correspond to a portion of the second region B for subsequently forming the first trench. Therefore, when the number of the second mask patterns 102b is increased, the width of the first trench may be increased. When the number of the second mask patterns 102b is 20 or more, the first trench width may be 20 times or more times the first pitch P, which may be undesirable. In example embodiments, the number of the second mask patterns 102b may be 1 to 20. Further, the width in the second direction of the portion of the second region B including the second mask patterns 102b may be in a range of about 10 nm to about 500 nm.

In the removing process, at least one preliminary first mask pattern adjacent to a portion for forming second mask pattern 102b in the second region B may be removed. Preferably, two or more preliminary first mask patterns may be removed. Regions of removed preliminary first mask patterns may correspond to a portion for subsequently forming a protrusion (e.g., protrusion 142 of FIG. 2A). Therefore, when the number of the removed preliminary first mask pattern is increased, a width of the protrusion may be increased.

In the second region B, at least one preliminary first mask pattern may remain between the regions of the removed preliminary first mask patterns. The remaining preliminary first mask pattern may serve as the third mask pattern 102c. A portion of the second region B including the third mask pattern 102c may correspond to a portion for subsequently forming a second trench. Therefore, when the number of the third mask patterns 102c is increased, a width of the second trench may be increased. The width of the second trench may not affect a defect of the device isolation region B, so that the number of the third mask patterns 102c may not be limited thereto.

For example, as shown in FIGS. 7 and 8, two second mask patterns 102b may be disposed (e.g., two second mask patterns 102b on both sides of the second region B), and three third mask patterns 102c may be disposed. Also, two preliminary first mask patterns may be removed between the second and third mask patterns 102b and 102c. However, the number of the second and third mask patterns 102b and 102c and the number of the removed preliminary first mask patterns may not be limited thereto.

Figure 9:
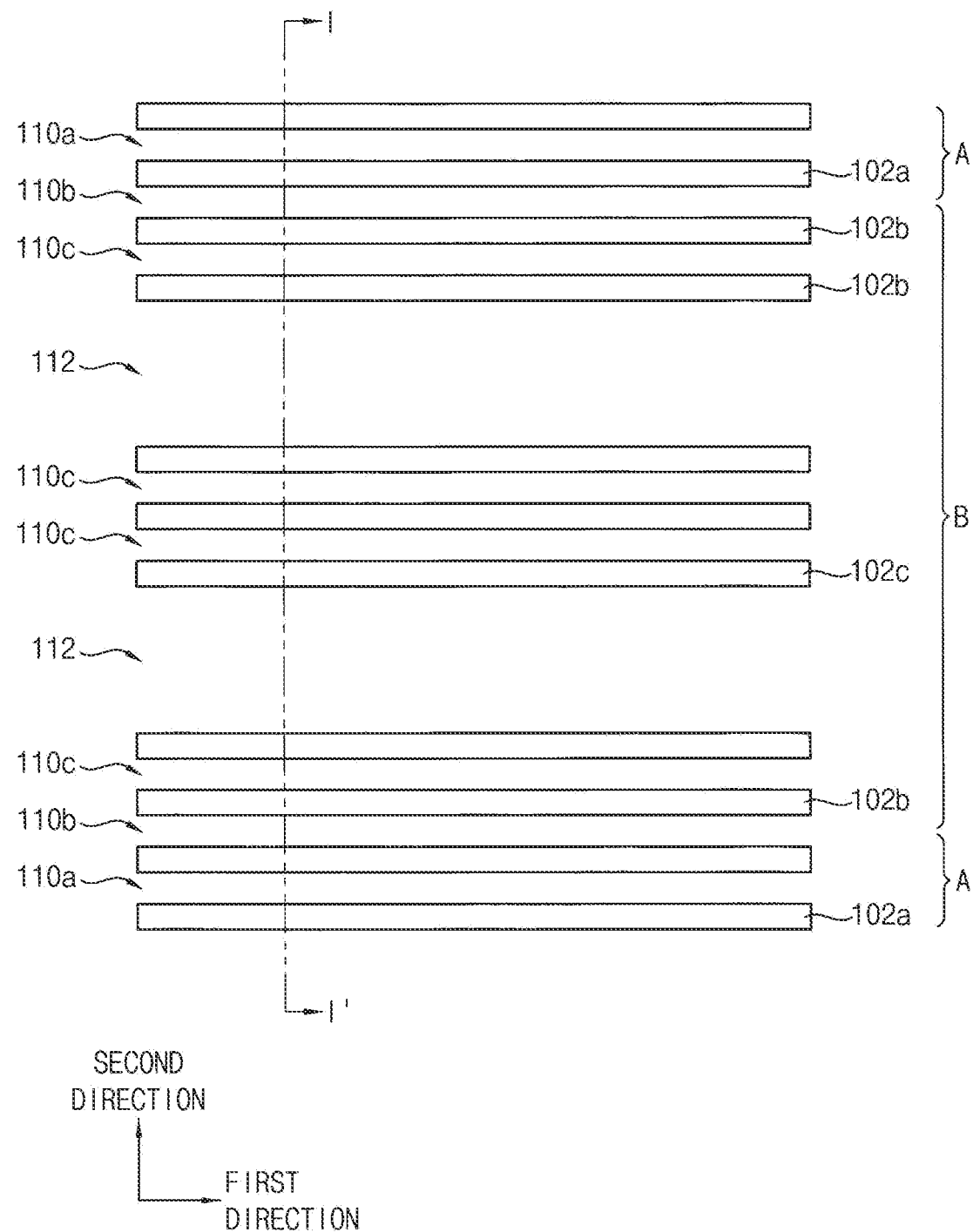
Figure 10:
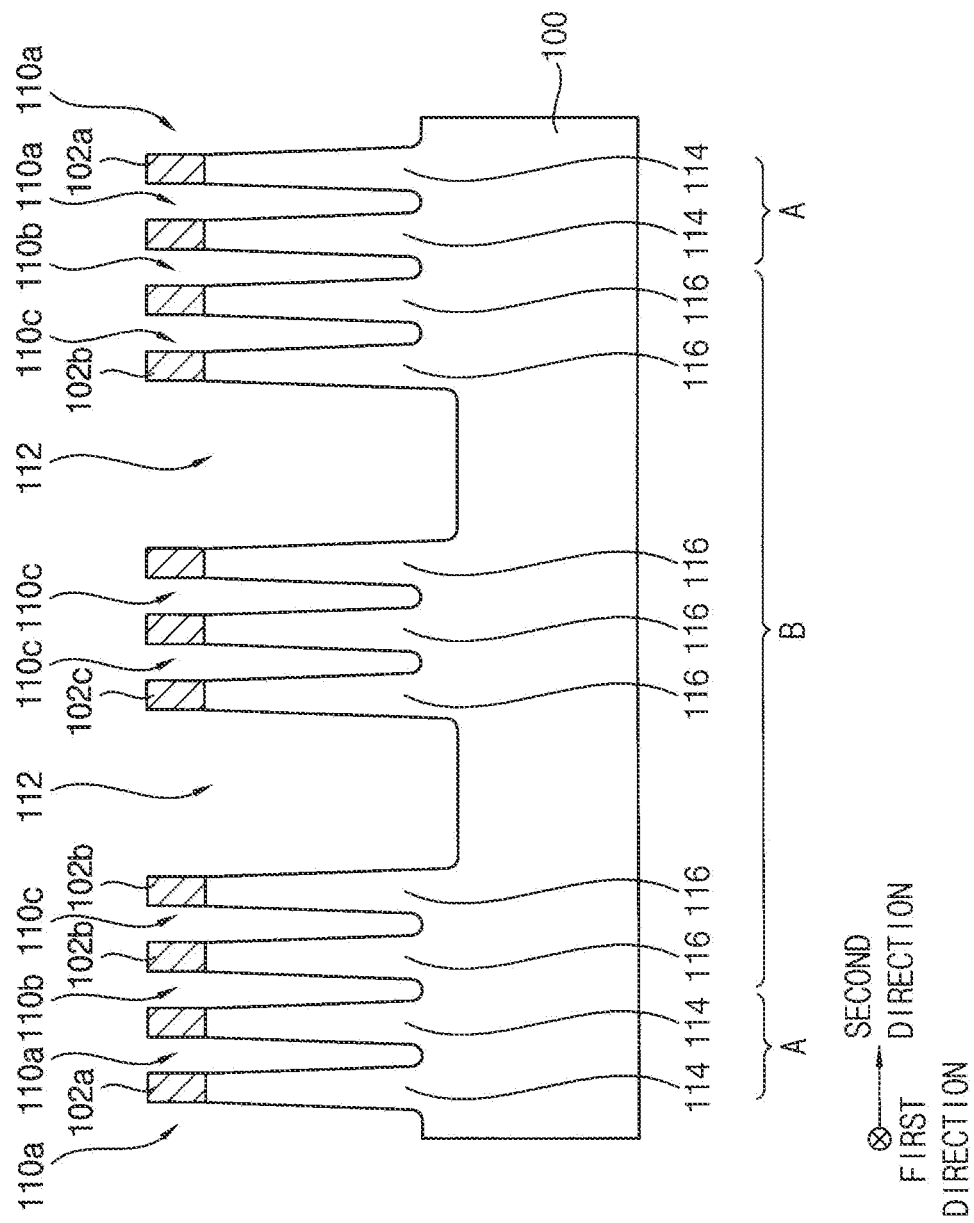

Referring to FIGS. 9 and 10, an upper portion of the substrate 100 may be etched using the first to third mask patterns 102a, 102b, and 102c as an etching mask to form first active patterns 114 in the first region A and second active patterns 116 in the second region B.

In the etching process, a first gap 110a may be formed between the first active patterns 114, and a second gap 110b may be formed between the first and the second active patterns 114 and 116 disposed at an interface between the first and second regions A and B. In the second region B, a third gap 110c and a fourth gap 112 may be formed between the second active patterns 116. The third gap 110c may correspond to a portion between the second mask patterns 102b and/or a portion between the third mask patterns 102c. The fourth gap 112 may correspond to a portion between the second and third mask patterns 102b and 102c.

Due to characteristics of the etching process, the first and second active patterns 114 and 116 formed by the etching process may not have completely vertical sidewalls respect to an upper surface of the substrate 100.

In the etching process, as the gap between the active patterns is decreased, the active patterns may have a nearly vertical sidewall. On the other hand, when the gap between the active patterns is increased, the sidewall slope of the active pattern may be gentle (e.g., less vertical) due to an etching loading.

In example embodiments, sidewalls of the first active patterns in the first region A may have a first angle in a range of about 85° to about 90°. Preferably, the first angle may be in a range of about 87° to about 90°. Sidewalls of the second active patterns 116 in the second region B may have the first angle. That is, the sidewalls of the first active patterns 114 and the sidewalls of the second active patterns 116 may be formed to have the first angle.

However, as the width between the second mask pattern 102b and the third mask pattern 102c is relatively wide, the sidewall of the second active patterns 116 corresponding to the sidewall of the fourth gap 112 may have a second angle less than the first angle. In example embodiments, the sidewall of the second active pattern 116 corresponding to the sidewall of the fourth gap 112 may be formed to have an angle of about 80° to about 90°.

Further, in the etching process, as a width between the patterns is greater, the etching rate may be increased by the etching loading, and thus an etching depth may be increased. As the width between the second mask pattern 102b and the third mask pattern 102c is relatively large, a bottom of the fourth gap 112 may be further lowered. That is, bottoms of the first to third gaps 110a, 110b, and 110c may be coplanar with each other, and bottoms of the fourth gaps 112 may be lower than the bottoms of the first to third gaps 110a, 110b, and 110c. The bottom of the fourth gap 112 may correspond to a top surface of a protrusion that is subsequently formed.

As described above, at least one second active pattern 116 may be formed at the edge portion of the second region B using the second mask pattern 102b. Also, the first active pattern 114 at the edge in the second direction of the first region A and the second active pattern 116 at the edge in the second direction of the second region B may be arranged to face each other with a space therebetween of the first distance.

Figure 11:
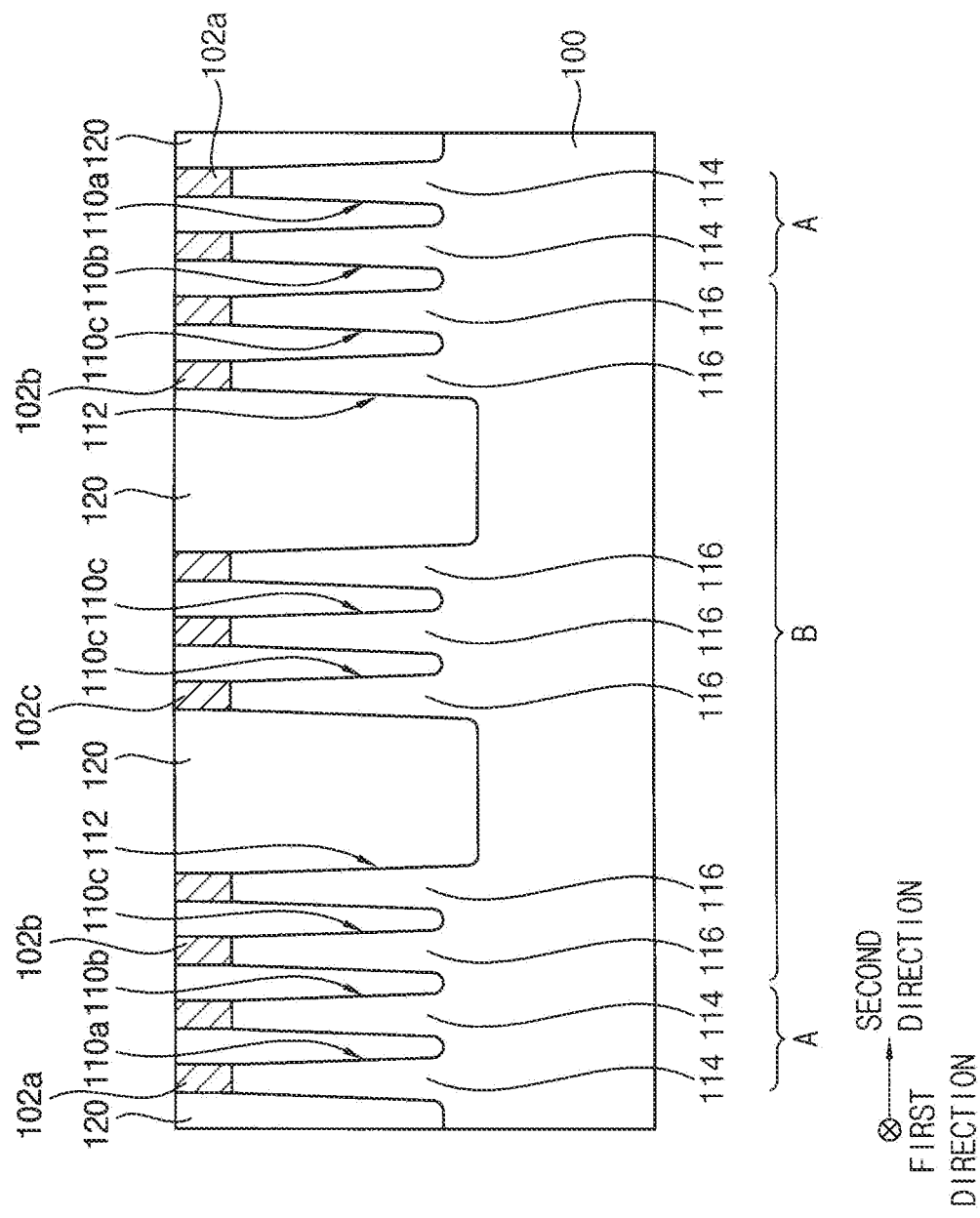

Referring to FIG. 11, a first isolation layer may be formed to fill the first to fourth gaps 110a, 110b, 110c, and 112. The first isolation layer may be planarized until upper surfaces of the first to third mask patterns 102a, 102b, and 102c may be exposed to form a first isolation pattern 120.

Figure 12:
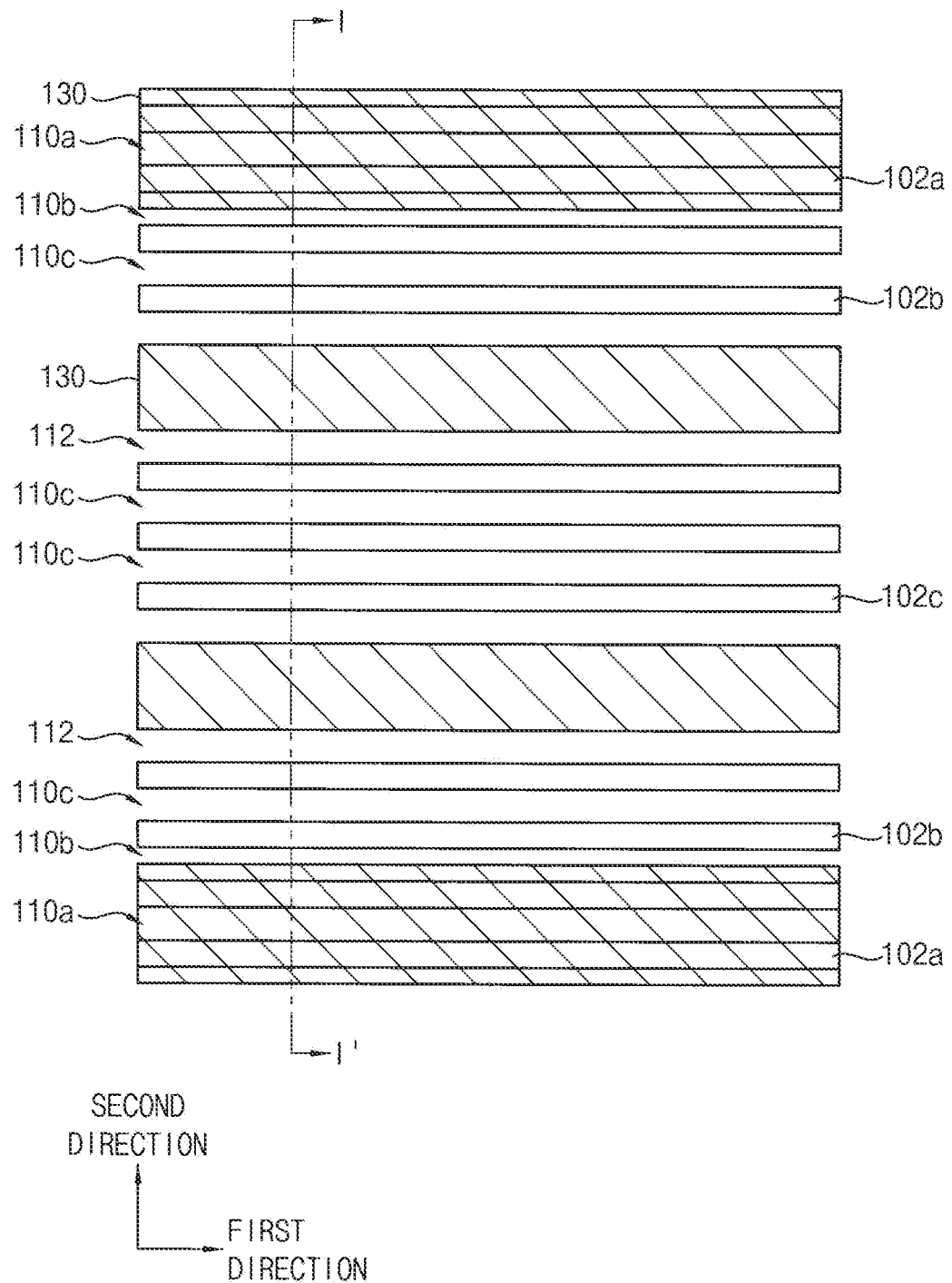
Figure 13:
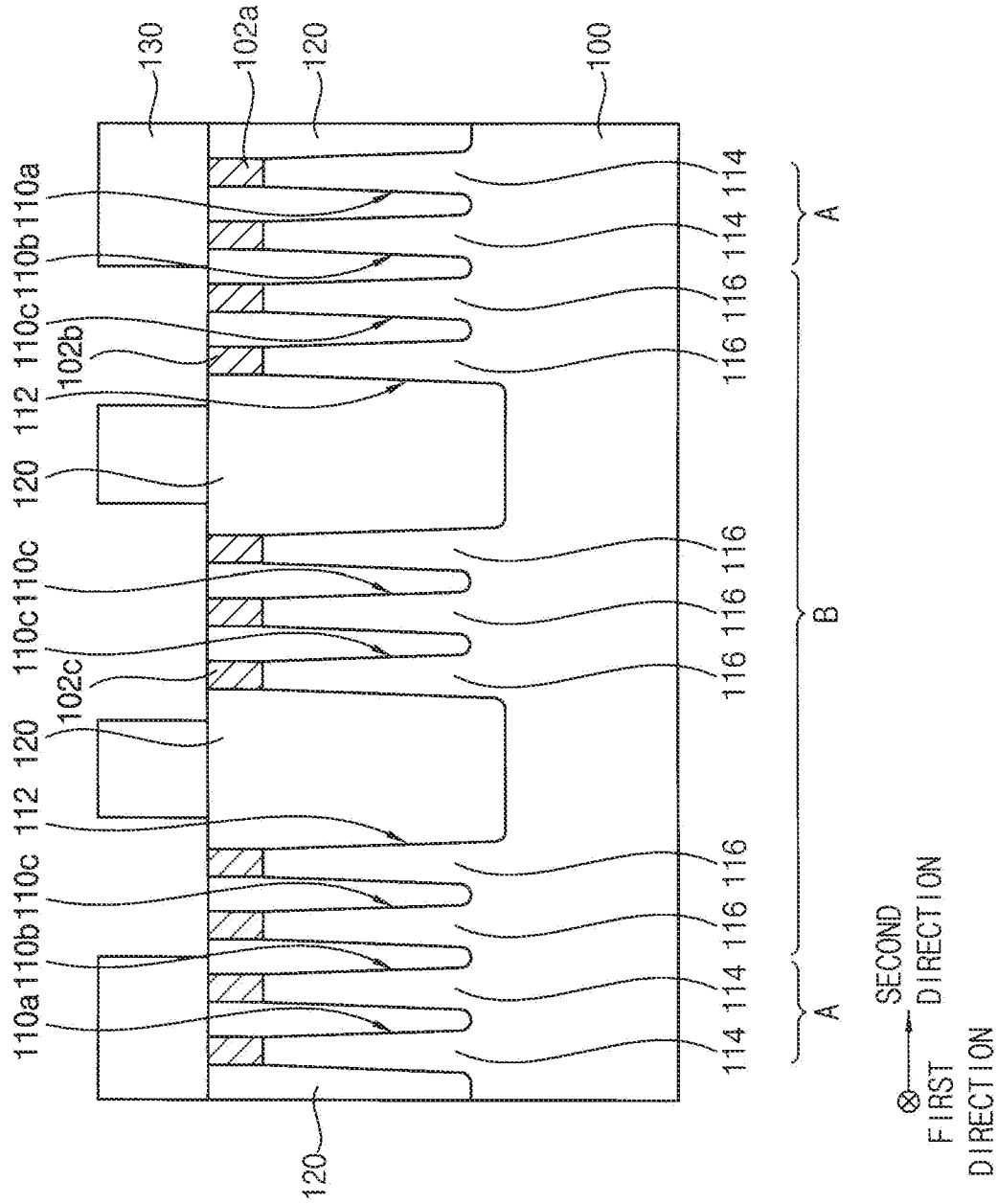

Referring to FIGS. 12 and 13, an upper etching mask 130 may be formed on the first to third mask patterns 102a, 102b, and 102c and the first isolation pattern 120.

The upper etching mask 130 may be on and/or entirely cover the first regions A. In the second region B, the upper etching mask 130 may be formed to be on and/or cover the regions of the removed preliminary first mask patterns and regions between the removed preliminary first mask patterns. That is, the upper etching mask 130 may have one line shape covering the regions of the removed preliminary first mask patterns and the regions between the removed preliminary first mask patterns.

Therefore, the second and third mask patterns 102b and 102c in the second region B may be exposed by the upper etching mask 130.

Figure 14:
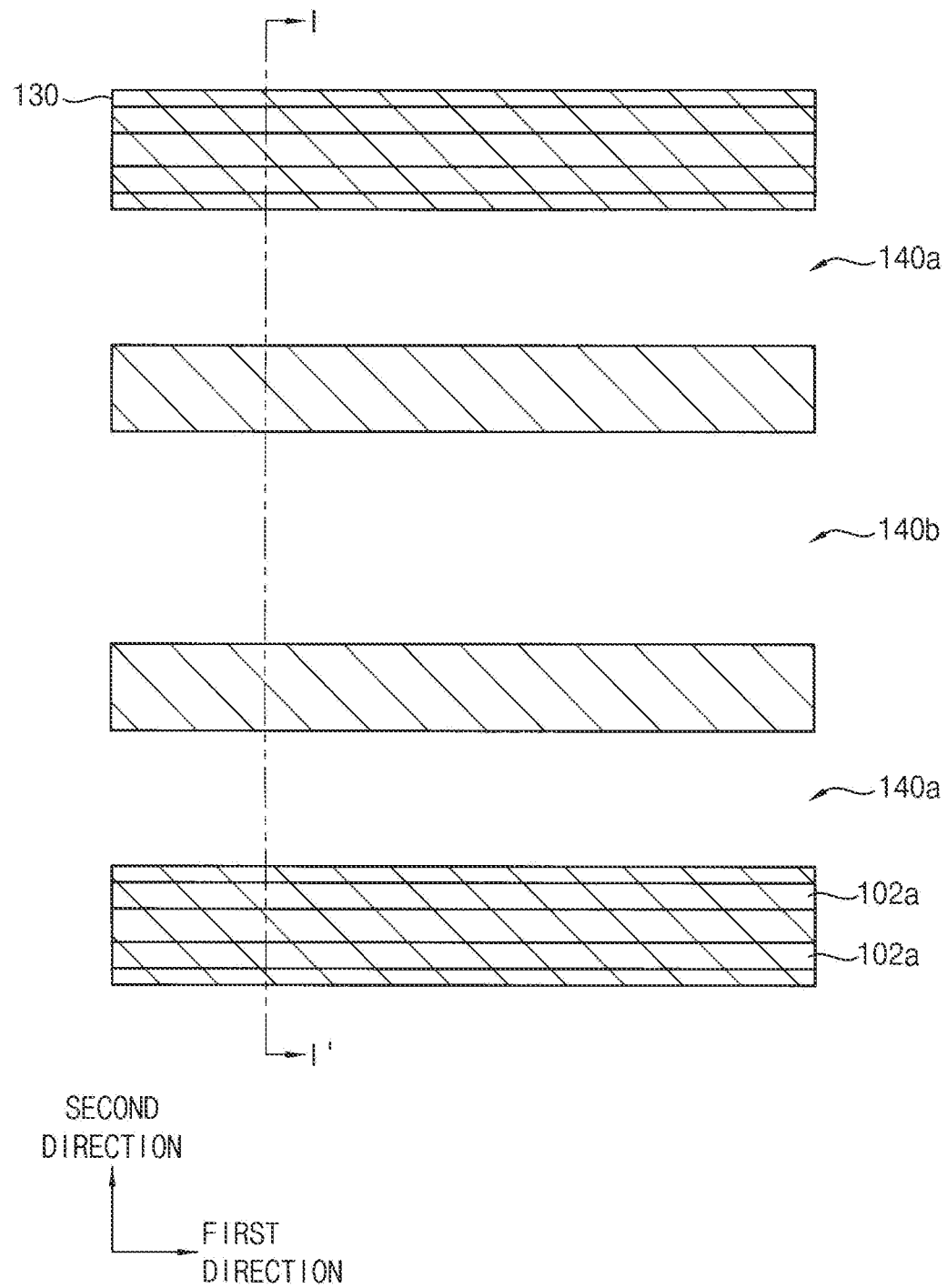
Figure 15:
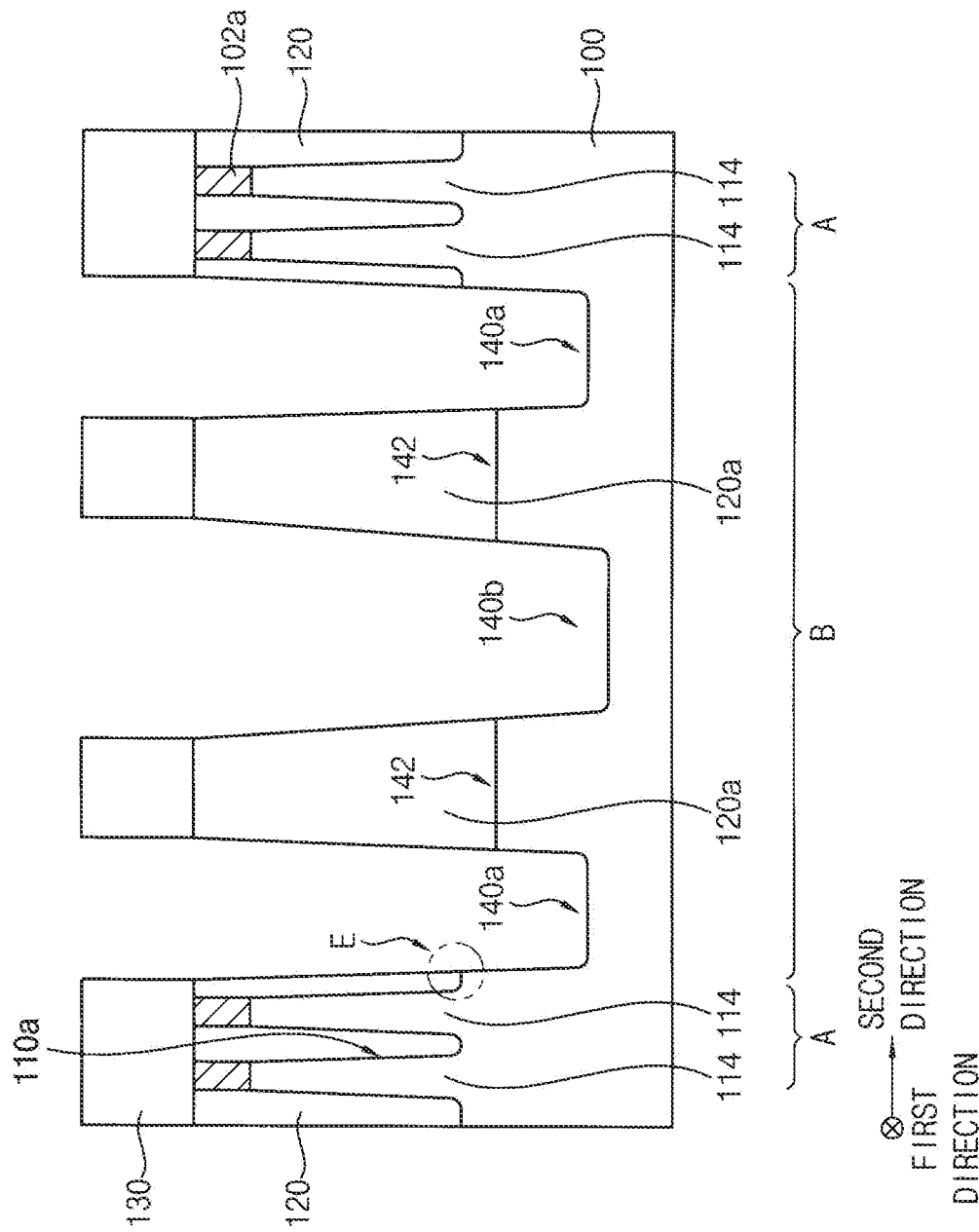

Referring to FIGS. 14 and 15, the second and third mask patterns 102b and 102c, the first isolation pattern 120, and the second active patterns 116 may be etched using the upper etching mask 130 as an etching mask. Therefore, first and second trenches 140a and 140b may be formed between the upper etching masks 130 in the second region B. When the etching process is performed, the entire first region A may be covered by the upper mask pattern 130. Thus, the first active pattern 114 and the first isolation pattern 120 may remain in the first region A without etching. Further, the first isolation pattern in the second region may be etched to form the second isolation pattern 120a.

The first trench 140a may be formed at both edges of the second region B adjacent to the first region A. Thus, two first trenches 140a may be included in the second region B. The second trench 140b may be formed between the first trenches 140a.

In the etching process, a bottom of the first trench 140a may be lower than a bottom of the first gap 110a between the first active patterns 114. Therefore, the protrusion 142 may be generated between the first and second trenches 140a and 140b. The second trench 140b may be disposed between the protrusions 142.

Sidewalls of the first trench 140a may be formed to have an angle in a range of about 85° to about 90°. Preferably, the sidewalls of the first trench 140a may have an angle of about 87° to about 90°. When the sidewall of the first trench 140a has an angle lower than 85°, defects in which at least a portion of the second active pattern formed at a portion adjacent to the first region A is not etched may occur.

As shown, in an example embodiment, two first trenches 140a and one second trench 140b may be formed in the second region B. Therefore, a width of an etched portion for forming each of the first and second trenches 140a and 140b may be reduced in comparison with a case where one wide trench is formed in the second region B. As such, the width of the etched portion for forming each of the first and second trenches 140a and 140b may be decreased, so that a sidewall slope of the first trench 140a may be close to 90°. Therefore, the width of the first trench 140a may be controlled to have the sidewall slope of about 85° to 90° by the etching process.

The sidewall slope of the second trench 140b may not be limited thereto. That is, the sidewall slope of the second trench 140b may be greater or smaller than the sidewall slope of the first trench 140a.

In example embodiments, as shown in FIG. 15, the width of the second trench 140b may be greater than the width of the first trench 140a.

In some example embodiments, as shown in FIG. 3, the width of the second trench 140b may be smaller than the width of the first trench 140a.

In some example embodiments, as shown in FIG. 4, the width of the second trench 140b may be formed to be substantially the same as the width of the first trench 140a.

Figure 16:
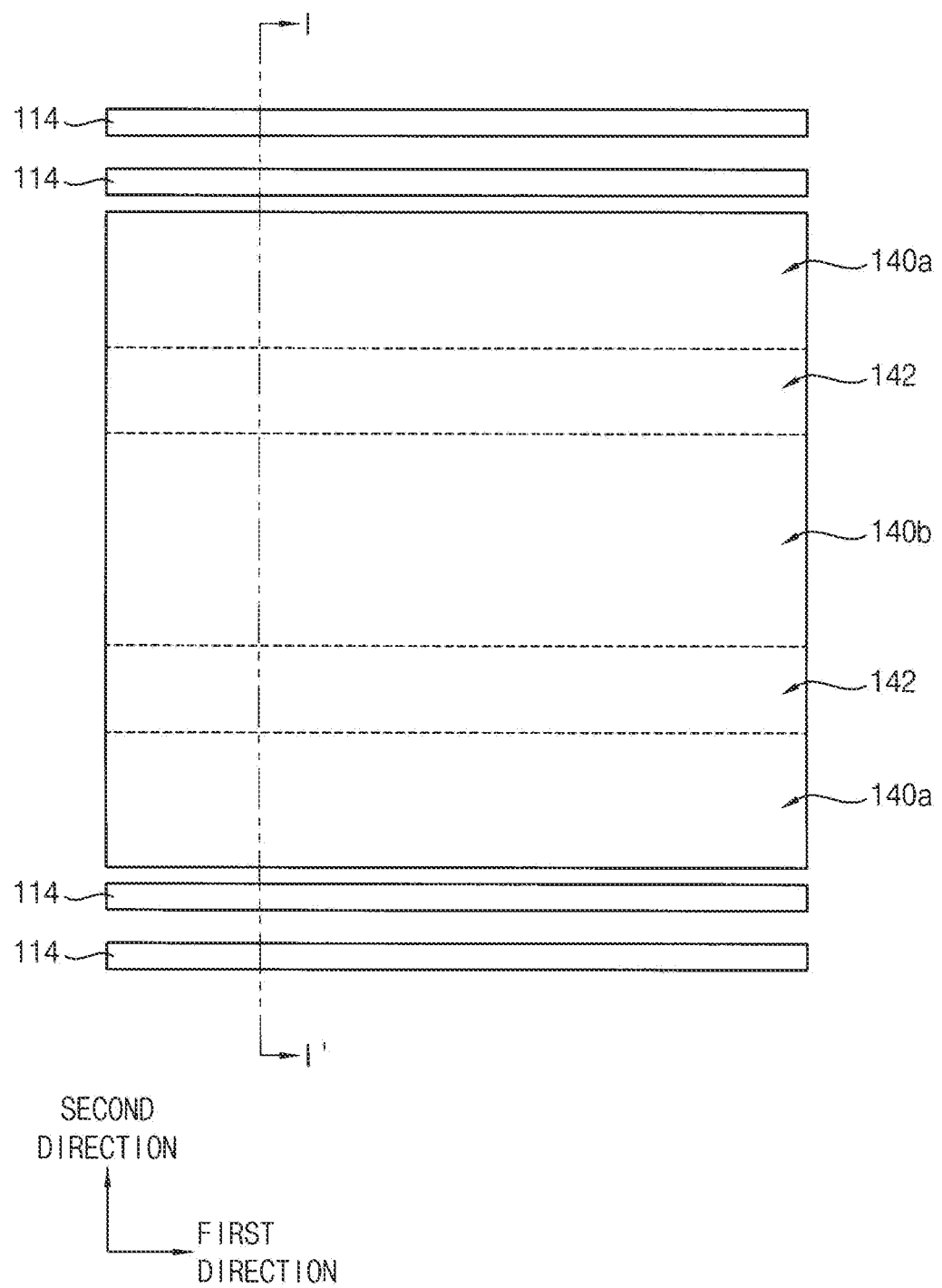
Figure 17:
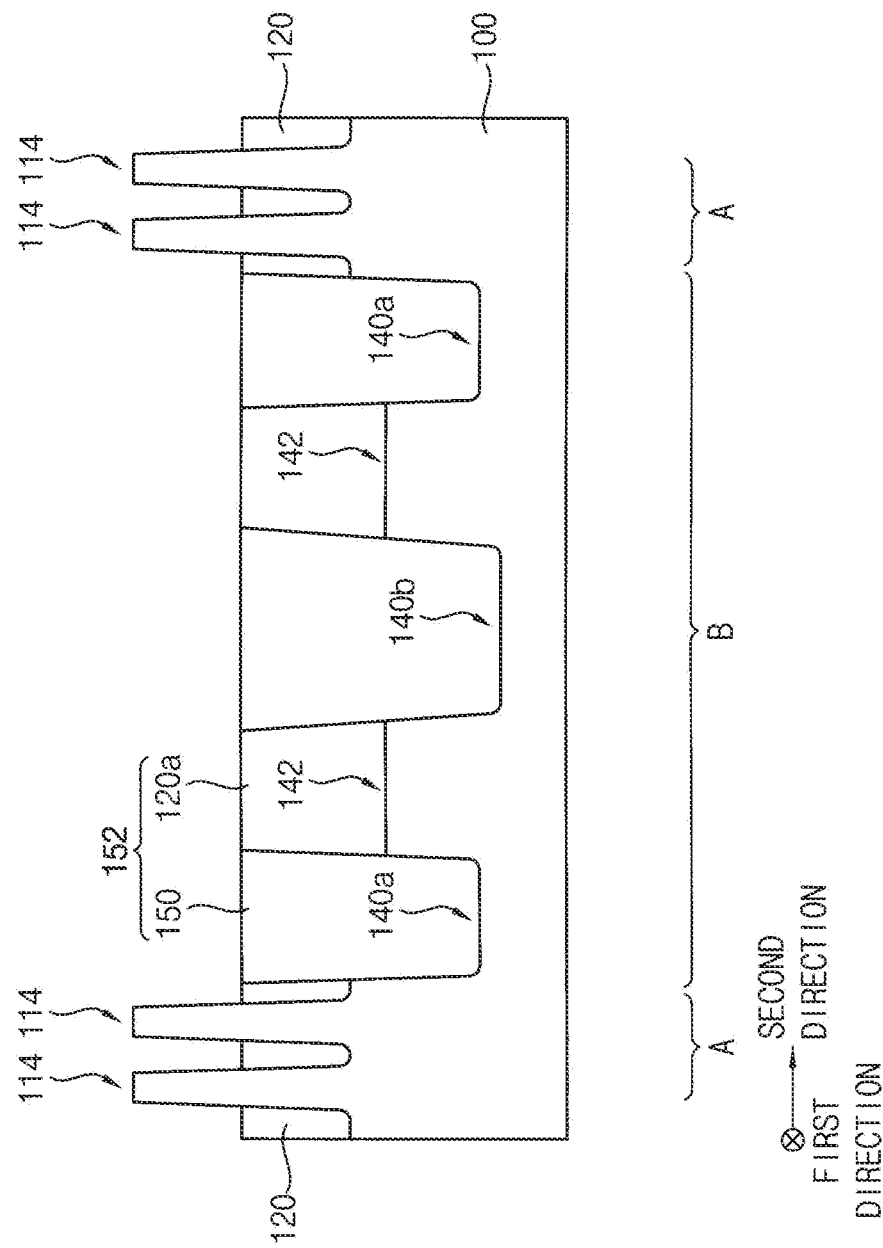

Referring to FIGS. 16 and 17, the upper etching mask 130 may be removed, and an isolation structure 152 may be formed to fill the first and second trenches 140a and 140b.

In example embodiments, a second isolation layer filling the first and second trenches 140a and 140b may be formed on the first active pattern 114, the first mask pattern 102a, and the first and second isolation layers. The second isolation layer may be planarized until an upper surface of the first mask pattern may be exposed to form a third isolation pattern.

Thereafter, upper portions of the first to third isolation patterns 120, 120a and 150 may be etched to partially expose upper sidewalls of the first active patterns 114. Thus, the first active patterns 114 may include a lower active pattern of which sidewalls are covered by the first isolation pattern 120 and an upper active pattern protruding from the first isolation pattern 120.

The first to third isolation patterns 120, 120a, and 150 may include substantially the same material, and thus may be merged with each other. The first isolation pattern 120 may be formed in the first region A. The isolation structure 152 including the second and third isolation patterns 120a and 150 may be formed in the second region B.

Referring to FIGS. 1, 2A, and 2B again, a finFET may be formed on the first isolation pattern 120, the isolation structure 152, and the upper active pattern. The finFET formed in the first region A may be capable of being operated.

The finFET may include a gate structure 160 extending in a second direction and a source/drain layer 162 formed on both sides of the gate structure 160. The gate structure 160 may include a gate insulation layer 160a, a gate electrode 160b, and a hard mask pattern 160c stacked on one another. In the process for forming the gate structure 160, a width of the upper active pattern is slightly decreased to form the active fin 115. The active fin 115 may include a lower active fin 115b and an upper active fin 115a. A width of the upper active fin 115a may be less than the width of the lower active fin 115b.

An example of a method for forming the finFET will be briefly described.

First, a dummy gate structure (not shown) may be formed on the first isolation pattern 120, the isolation structure 152, and the upper active pattern. The dummy gate structure may extend in the second direction. Spacers may be formed on sidewalls of the dummy gate structure.

The first active patterns exposed by both sides of the dummy gate structure may be partially etched to form the recess. The source/drain layer may be formed in the recess.

A first insulating interlayer (not shown) covering the dummy gate structure, the spacers, and the source/drain layer may be formed, and the first insulating interlayer may be planarized until an upper surface of the dummy gate structure may be exposed. Thereafter, the dummy gate structure may be removed to form the gate trench.

The gate structure 160 may be formed in the gate trench.

In example embodiments, the gate insulation layer 160a may include a metal oxide having a dielectric constant higher than a dielectric constant of silicon oxide. For example, the gate insulation layer 160a may include an interface pattern and a high dielectric pattern. A surface of the upper active pattern may be oxidized to form the interface pattern. In the oxidation process, the surface of the upper active pattern may be oxidized so that the width of the upper active pattern may be slightly decreased. Therefore, the active fin 115 including the upper active fin 115a and the lower active fin 115b may be formed.

Although not shown, a second insulating interlayer covering the gate structure 160 may be formed, and a first contact plug contacting the source/drain layer may be formed through the first and second insulating interlayers.

A second contact plug contacting the gate electrode 160b and a wiring electrically connected to the first contact plug and the second contact plug may be further formed.

As described above, all of the second active patterns formed in the second region B may be effectively removed. Therefore, only active fins for forming the finFET may be formed in the first region A, and the second region may have excellent device isolation characteristics.

In the manufacturing of the semiconductor device, the number of the second mask patterns, the number of the third mask patterns, and the distance between the second and third mask patterns may be controlled, so that shapes of the trenches and the protrusion formed in the second region B may be changed. Hereinafter, example embodiments of the semiconductor device having different shapes of trenches and protrusions in the second region will be described.

Figure 18:
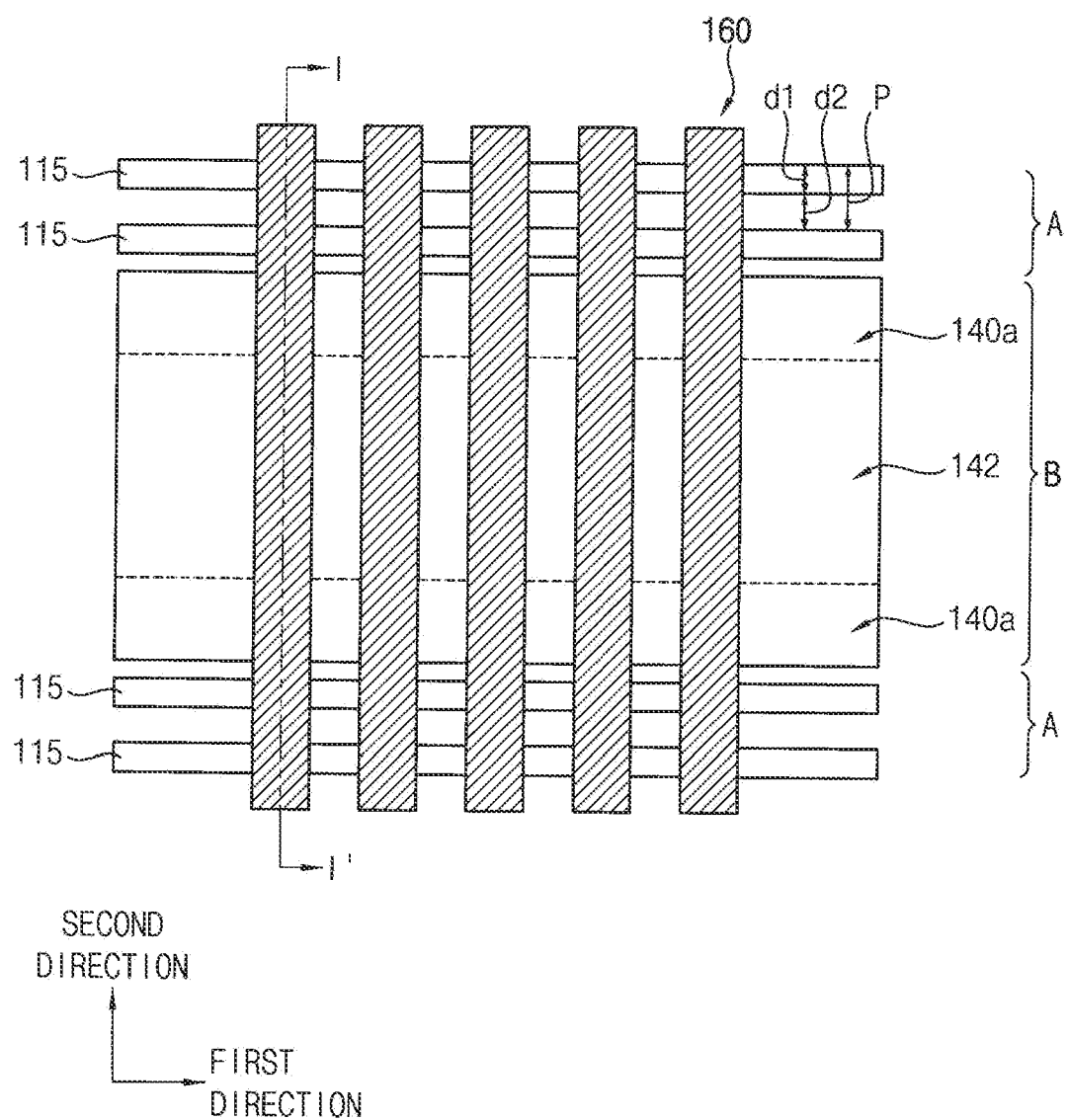
Figure 19:
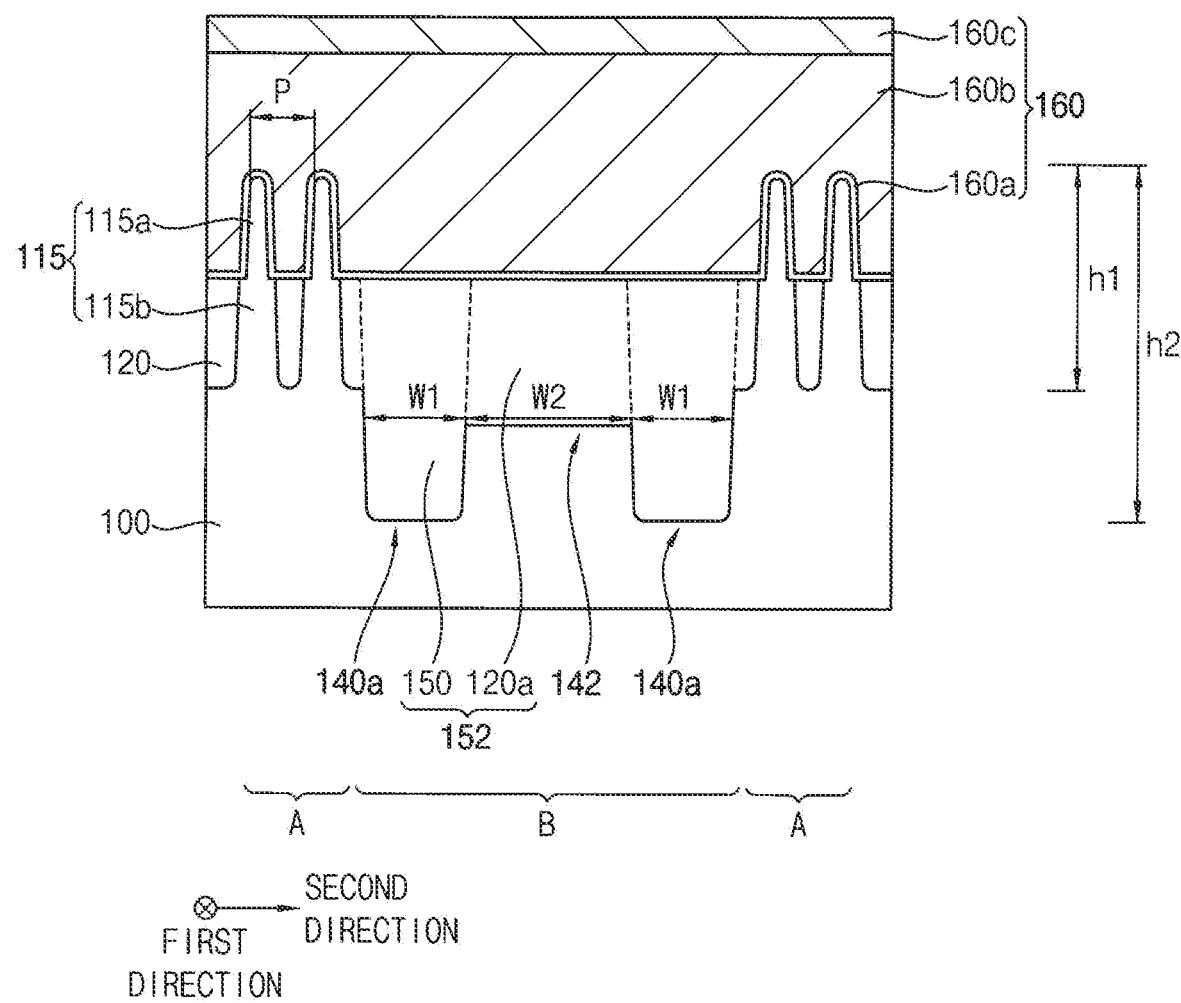

FIGS. 18 and 19 are a plan view and a cross-sectional view illustrating a semiconductor device in accordance with example embodiments.

The semiconductor device shown in FIGS. 18 and 19 is substantially the same as the semiconductor device shown in FIGS. 1, 2A, and 2B, except that the second trench is not included. Therefore, the first trenches and the protrusions formed in the second region may be mainly described.

Referring to FIGS. 18 and 19, the first trenches 140a may be formed at both side edges of the second region B adjacent to the first region A, respectively. That is, two first trenches 140a may be formed in the second region B.

In example embodiments, one protrusion 142 may be formed between the first trenches 140a. That is, two first trenches 140a and one protrusion 142 may be formed in the substrate 100 of the second region B. For forming one of the trenches, a width of at least the first pitch P may be needed. Also, for forming of the protrusion, a width of at least the first pitch P may be needed. Therefore, in this example embodiment, the width of the second region B may be greater than at least three times the first pitch P.

In example embodiments, the sidewall slope of the first trench 140a may be about 85° to about 90°. In addition, the width of the first trench 140a may be greater than 0.7 times the first pitch P and less than 20 times the first pitch P. For example, the width of the first trench 140a may be in a range of about 10 nm to about 500 nm.

In example embodiments, the width of the protrusion 142 may be greater than the width of the active fin 115. The width of the protrusion 142 may be greater than 0.7 times the first pitch P. Preferably, the width of the protrusion 142 may be the same as the first pitch P or greater than the first pitch P.

In example embodiments, the first trenches 140a formed in the second region B may be symmetrical to each other with respect to a line extending in the first direction through a center (e.g., in the second direction) of the second region B.

Figure 20:
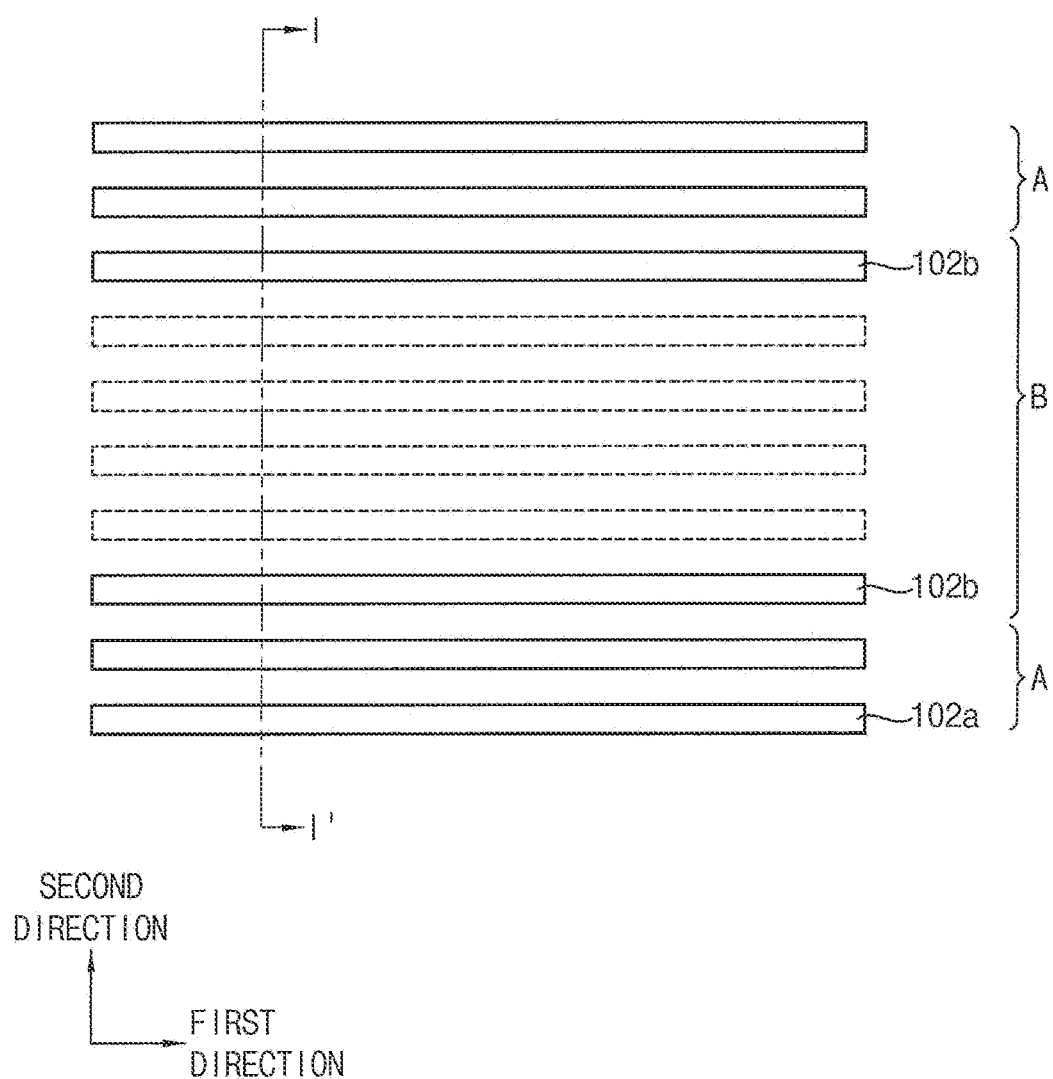
Figure 21:
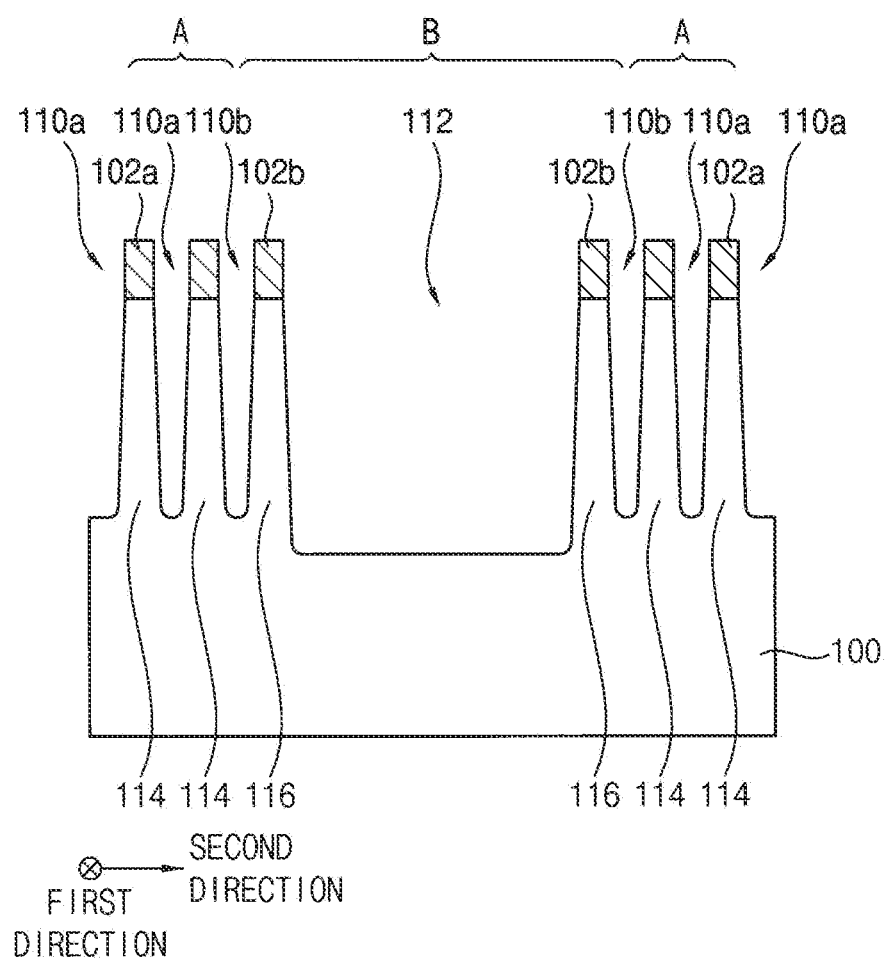

FIGS. 20 and 21 are a plan view and a cross-sectional view illustrating stages of a method of manufacturing a semiconductor device in accordance with example embodiments.

First, the processes as illustrated with reference to FIGS. 5 and 6 may be performed. Referring to FIG. 20, a subset of the preliminary first mask patterns 102 formed in the second region B may be removed to form a first mask pattern 102a in the first region A and a second mask pattern 102b in the second region B, respectively.

The second mask pattern 102b may be a remained preliminary first mask pattern at each of the edges in the second direction of the second region B. A portion of the second region B containing the second mask pattern 102b may correspond to a portion for forming the first trench.

Further, the preliminary first mask patterns between the second mask patterns 102b may be removed, and the removed subsets of the preliminary first mask patterns (that is, dashed portions in FIG. 20) may correspond to a portion for forming the first protrusion.

Referring to FIG. 21, the substrate 100 may be etched using the first and second mask patterns 102a and 102b to form a first active pattern 114 and a second active pattern 116, respectively. The etching process may be substantially the same as illustrated with reference to FIGS. 9 and 10.

Thereafter, processes as described with reference to FIGS. 11 to 17 may be performed to manufacture the semiconductor device shown in FIGS. 18 and 19.

Figure 22:
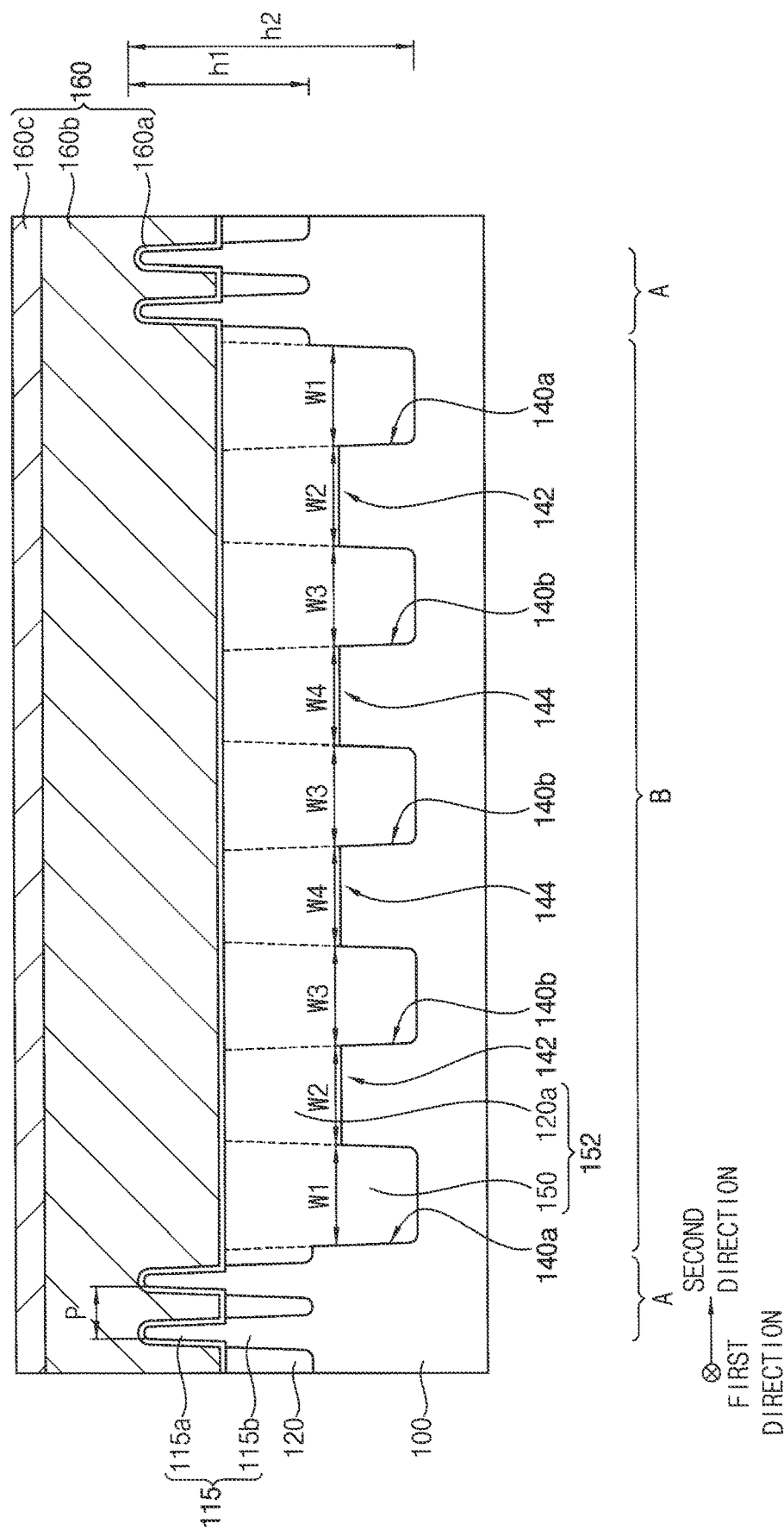
Figure 23:
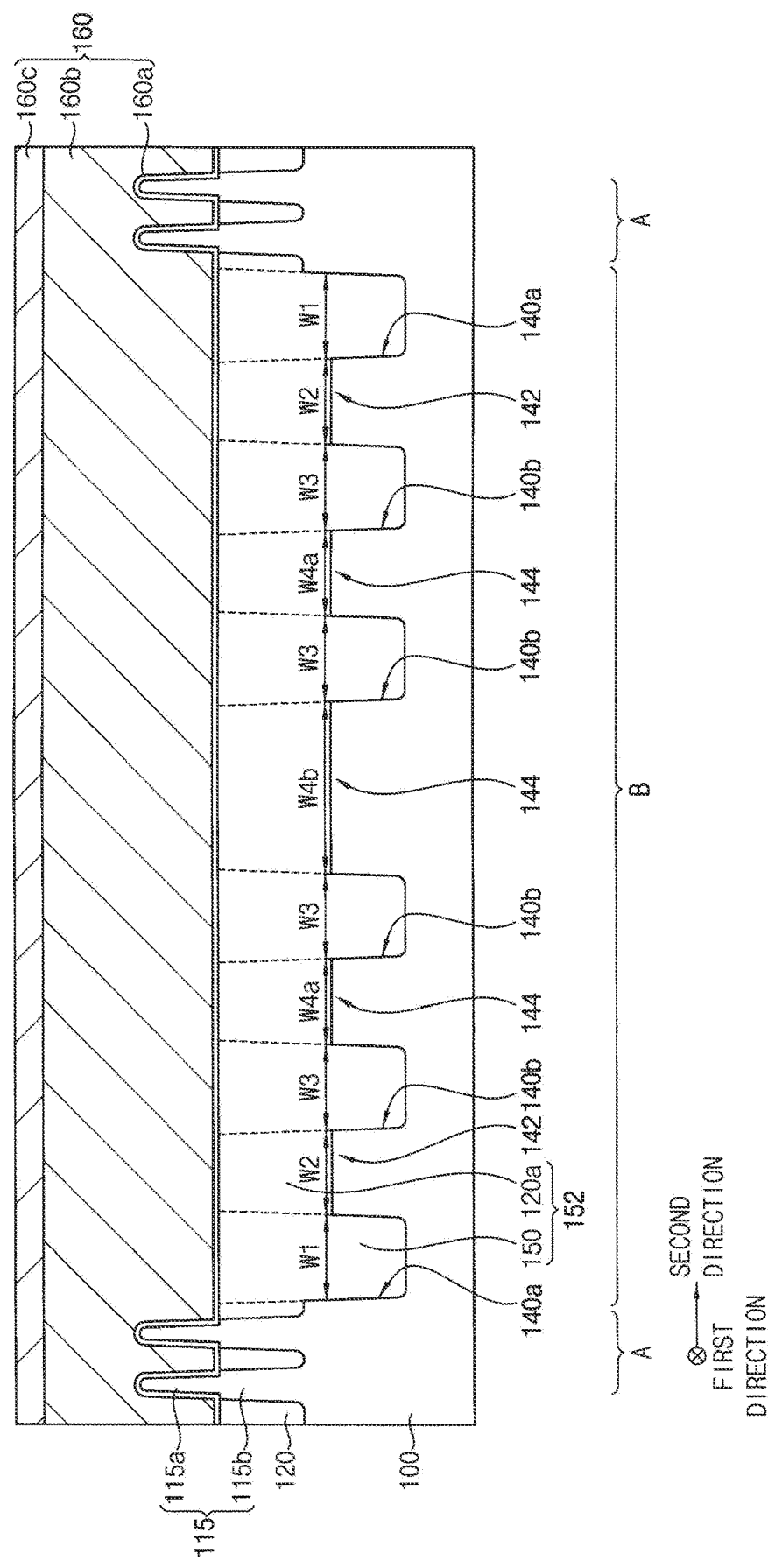
Figure 24:
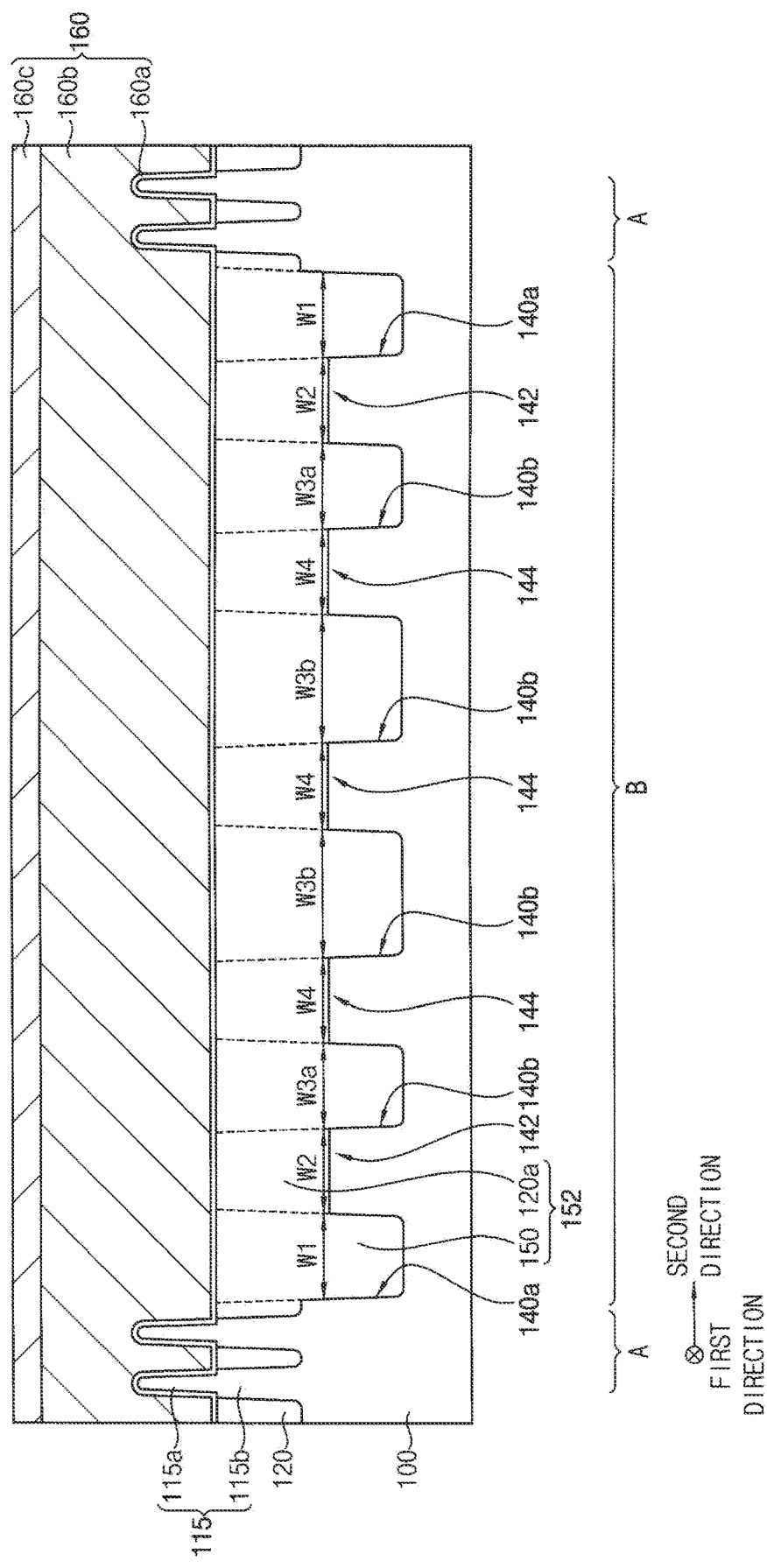
Figure 25:
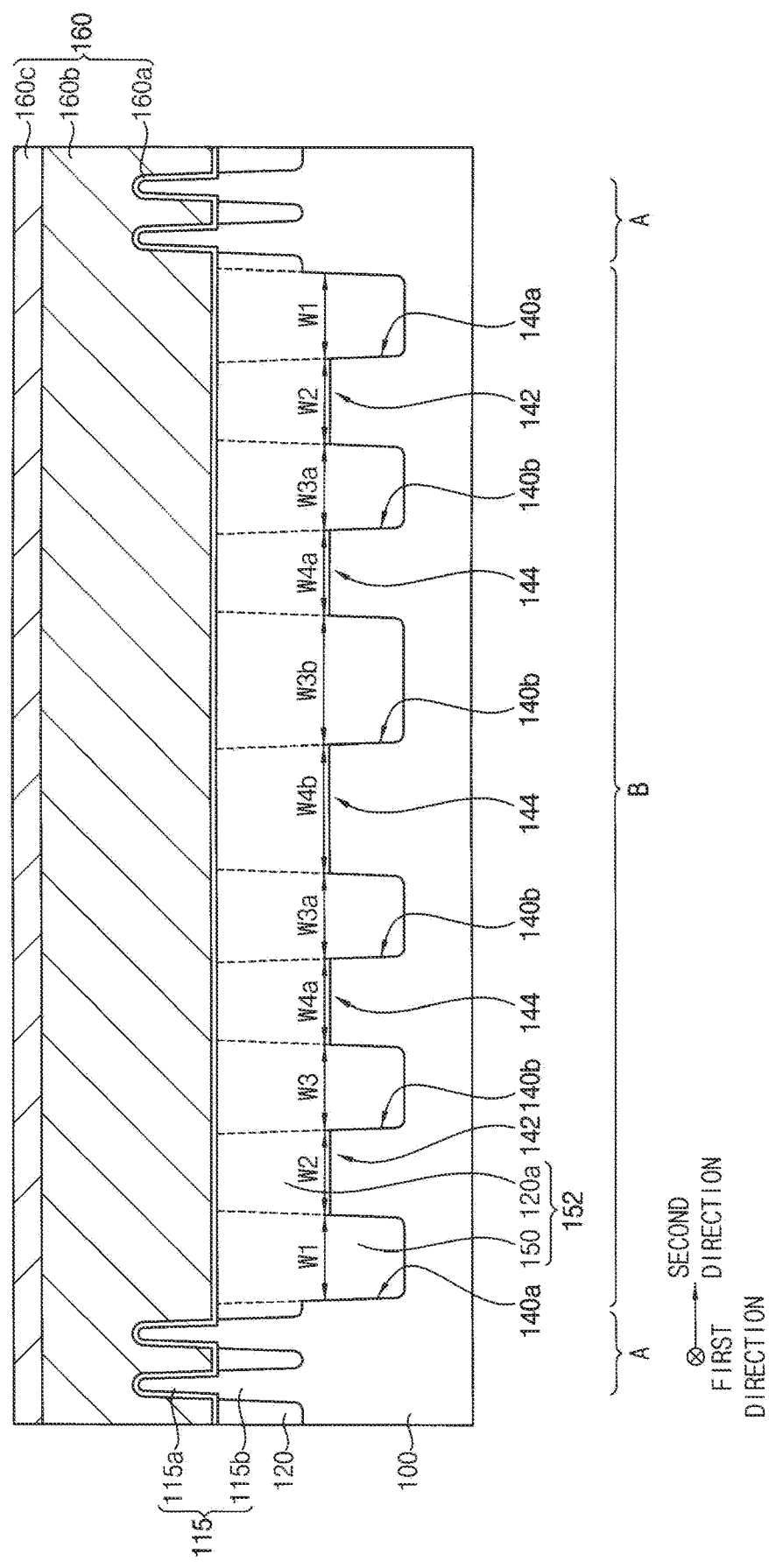

FIG. 22 is a cross-sectional view illustrating a semiconductor device in accordance with example embodiments. FIGS. 23 to 25 are cross-sectional views illustrating semiconductor devices in accordance with example embodiments.

Each of the semiconductor devices shown in FIGS. 22 to 24 may be substantially the same as the semiconductor device shown in FIGS. 1, 2A, and 2B, except that each of the semiconductor devices illustrated in FIGS. 22 to 24 may include a plurality of second trenches between the first trenches. Also, a second protrusion may be further included between the plurality of second trenches. Therefore, the first and second trenches and the second protrusion formed in the second region are mainly described.

Referring to FIG. 22, the first trenches 140a may be formed at both side edges of the second region B adjacent to the first region A, respectively. That is, two first trenches 140a may be formed in the second region B.

A plurality of second trenches 140b may be formed between the first trenches 140a. A first protrusion 142 may be formed between the first trench 140a and the second trench 140b. A second protrusion 144 may be formed between the second trenches 140b. Thus, at least one second protrusion 144 may be formed in the second region B.

In example embodiments, the sidewall slope of the first trench 140a may be about 85° to about 90°. Further, a width of the first trench 140a may be greater than 0.7 times the first pitch P and less than 20 times the first pitch P. For example, the width of the first trench 140a may be in a range of about 10 nm to about 500 nm.

In example embodiments, a width W2 of each of the first protrusions 142 and a width W4 of each of the second protrusions 144 may be greater than a width of the active fin 115. Each of the widths W2 and W4 of the first and second protrusions 142 and 144 may be greater than 0.7 times the first pitch P1.

In example embodiments, as shown in FIG. 22, the widths W4 of the second protrusions 144 may be equal to each other. Also, the widths W2 and W4 of the first and second protrusions 142 and 144 may be substantially the same. In example embodiments, the widths W3 of each of the second trenches 140b may be substantially the same. Further, the widths W1 and W3 of the first and second trenches 140a and 140b may be substantially the same.

In some example embodiments, as shown in FIG. 23, the widths W4a and W4b of some of the second protrusions 144 may be different from each other. The widths W3 of the second trenches 140b may be substantially the same as or different from each other.

In some example embodiments, as shown in FIG. 24, the widths W3a and W3b of some of the second trenches 140b may be different from each other. In example embodiments, the slopes of the plurality of second trenches 140b may be substantially the same as or different from each other. The widths W4 of the second protrusions 144 may be the same as or different from each other.

In example embodiments, the first and second trenches 140a and 140b and the first and second protrusions may be symmetric with respect to a line extending in the first direction through a center (e.g., in the second direction) of the second region B.

As described above, the widths of the second trenches and the second protrusions may not be limited thereto.

Therefore, as shown in FIG. 25, the widths W3a and W3b of some of the second trenches 140b may be different from each other, and the widths W4a and W4b of some of the second protrusions 144 may be different from each other. Further, the first and second trenches 140a and 140b and the first and second protrusions 142 and 144 may be asymmetric with respect to a line extending in the first direction through the center (e.g., in the second direction) of the second region B.

FIG. 26 is a plan view illustrating a method of manufacturing a semiconductor device in accordance with example embodiments.

First, the processes as illustrated with reference to FIGS. 5 and 6 may be performed.

Thereafter, referring to FIG. 26, a portion of the preliminary first mask patterns 102 formed in the second region B may be removed to form a first mask pattern 102a in the first region A and second and third mask patterns 102b and 102c in the second region B.

Further, in a portion between the second mask patterns in the second region, a removed region of at least one preliminary first mask pattern 102 and a remaining region of at least one preliminary first mask pattern 102 may be repeatedly arranged.

The region of removed preliminary first mask patterns 102 adjacent to the second mask pattern 102b may correspond to a portion for forming the first protrusion. Further, the remaining portion of the preliminary first mask patterns 102 between the second mask patterns 102b may correspond to a portion for forming the second trench. In addition, the region of the removed preliminary first mask patterns 102 between the second trenches may correspond to a portion for forming the second protrusion.

Therefore, the widths of the first protrusion and the second protrusion may be controlled by controlling the number of the removed preliminary first mask patterns 102. Further, the widths and the slopes of the first and second trenches may be controlled by controlling the number of the remaining preliminary first mask patterns 102 in the second region B.

Thereafter, the same processes as illustrated with reference to FIGS. 9 to 17 may be performed. Thus, one of the semiconductor devices illustrated in FIGS. 22 to 25 may be manufactured.

The semiconductor device and method of manufacturing the semiconductor device may be used to form, e.g., a logic device such as a central processing unit (CPU, MPU), an application processor (AP), or the like, e.g., a volatile memory such as an SRAM device, a DRAM device, or the like and, e.g., non-volatile memory devices such as flash memory devices, PRAM devices, MRAM devices, RRAM devices, or the like.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method for manufacturing a semiconductor device, comprising:

forming preliminary mask patterns on a substrate including first regions and a second region between the first regions, each of the preliminary mask patterns extending in a first direction that is parallel to an upper surface of the substrate, the preliminary mask patterns regularly arranged and spaced apart from each other in a second direction that is parallel to the upper surface of the substrate and perpendicular to the first direction;

removing the preliminary mask pattern positioned at a first portion among the preliminary mask patterns formed in the second region to form mask patterns;

etching the substrate using the mask patterns as an etch mask to form first active patterns protruding from the substrate in the first region, second active patterns protruding from the substrate in the second region, and a second gap at the first portion in the second region;

forming a first isolation pattern in gaps between the first active patterns and gaps between the second active patterns; and forming an upper etching mask on the mask patterns and the first isolation pattern to cover an entirety of the first region and the first portion in the second region;

selectively etching the second active patterns and the first isolation pattern positioned at a second portion excluding the first portion in the second region using the upper etching mask as an etch mask to form a trench at the substrate in the second region, wherein the trench includes first trenches at first and second edges in the second direction of the second region and a protrusion between the first trenches, and a bottom of the first trenches is deeper than a bottom of the second gap.

2. The method of claim 1, wherein in a process of the removing the preliminary mask pattern positioned at the first portion, at least one preliminary mask pattern positioned at the first and second edges in the second direction of the second region is not removed.

3. The method of claim 1, wherein the second portion includes at least the first and second edges of the second region, and a width in the second direction of the second portion is in a range of 10 nm to 500 nm.

4. The method of claim 1, wherein in removing the preliminary mask pattern positioned at the first portion, adjacent two or more preliminary mask patterns are removed.

5. The method of claim 1, wherein the second portion includes the first and second edges in the second direction in the second region and at least one portion spaced apart from the first and second edges in the second direction in the second region.

6. The method of claim 1, wherein in etching the substrate using the mask patterns as the etching mask:

a first gap is formed between the first and second active patterns, and a bottom of the second gap is deeper than a bottom of the first gap.

7. The method of claim 1, wherein an edge active pattern of the first active patterns is at an edge portion among the first active patterns in the second direction, and an end portion of the edge active pattern extending laterally from a lower portion of the edge active pattern is connected to a sidewall of the one of the first trenches, and the end portion of the edge active pattern and the sidewall of the one of the first trenches have a non-linear shape.

8. The method of claim 1, wherein a sidewall slope of the first trenches, which is an angle between a sidewall of the one of the first trenches and a line parallel to a bottom of the one of the first trenches, is in a range of 85° to 90°.

9. The method of claim 1, wherein a sidewall slope of the first active pattern, which is an angle between a sidewall of the one of the first active patterns and a line parallel to a bottom of the one of the first active patterns, is in a range of 85° to 90°.

10. The method of claim 1, further comprising:

forming a second isolation pattern in the trench; and removing upper portions of the first isolation pattern and the second isolation pattern to expose upper portions of the first active pattern to form an isolation structure.

11. The method of claim 10, further comprising:

forming a gate structure extending in the second direction on the first active pattern and the isolation structure; and forming a source/drain layer on the first active patterns adjacent to the gate structure.

12. The method of claim 1, wherein a second height from a top surface of the one of the first active patterns to a bottom of the one of the first trenches is greater than 130% of a first height from the top surface of the one of the first active patterns to the bottom of the one of the first active patterns.

13. The method of claim 1, wherein an upper surface of the protrusion is deeper than a bottom of each of the first active patterns.

14. The method of claim 1, wherein a sum of a width of one of the first active patterns and a distance between adjacent ones of the first active patterns is a first pitch, and wherein a first width of the one of the first trenches is less than 20 times the first pitch.

15. A method for manufacturing a semiconductor device, comprising:

forming preliminary mask patterns on a substrate including first regions and a second region between the first regions, each of the preliminary mask patterns extending in a first direction that is parallel to an upper surface of the substrate, the preliminary mask patterns regularly arranged and spaced apart from each other in a second direction that is parallel to the upper surface of the substrate and perpendicular to the first direction;

removing the preliminary mask pattern positioned at a first portion among the preliminary mask patterns formed in the second region to form mask patterns, wherein ones of the mask patterns are formed at first and second edges in the second direction of the second region, and wherein, in the removing the preliminary mask pattern positioned at the first portion, at least one preliminary mask pattern positioned at the first and second edges in the second direction of the second region is not removed;

etching the substrate using the mask patterns as an etch mask to form first active patterns protruding from the substrate in the first region and second active patterns protruding from the substrate in the second region;

forming a first isolation pattern in gaps between the first active patterns and gaps between the second active patterns;

selectively etching the second active patterns and the first isolation pattern positioned at a second portion excluding the first portion in the second region to form a trench at the substrate in the second region;

forming a second isolation pattern in the trench; and removing upper portions of the first isolation pattern and the second isolation pattern to expose upper portions of the first active pattern to form an isolation structure, forming a gate structure extending in the second direction on the first active pattern and the isolation structure; and forming a source/drain layer on the first active patterns adjacent to the gate structure, wherein the trench includes first trenches at the first and second edges in the second direction of the second region and a protrusion between the first trenches, and wherein an upper surface of the protrusion is deeper than a bottom of each of the first active patterns.

16. The method of claim 15, wherein the second portion includes at least the first and second edges of the second region, and a width in the second direction of the second portion is in a range of 10 nm to 500 nm.

17. A method for manufacturing a semiconductor device, comprising:

partially etching a substrate including first regions and a second region between the first regions to form first active patterns protruding from the substrate in the first region, second active patterns protruding from the substrate in the second region, and a gap between ones of the second active patterns in a portion of the second region, wherein at least ones of the second active patterns are positioned at first and second edges of the second region;

forming a first isolation pattern in gaps between the first active patterns and gaps between the second active patterns;

forming an upper etching mask on the first isolation pattern to cover an entirety of the first region and the portion in the second region;

selectively etching the second active patterns and the first isolation pattern adjacent to the second active patterns using the upper etching mask as an etch mask to form a trench at the substrate in the second region; and forming a second isolation pattern in the trench, wherein the trench includes first trenches at the first and second edges in a second direction of the second region and a protrusion between the first trenches, wherein an upper surface of the protrusion is substantially planar, and wherein a bottom of the first trenches is deeper than a bottom of the gap, wherein each of the first active pattern extending in a first direction that is parallel to an upper surface of the substrate, the first active patterns regularly arranged and spaced apart from each other in the second direction that is parallel to the upper surface of the substrate and perpendicular to the first direction, and wherein a sum of a width of one of the first active patterns and a distance between adjacent ones of the first active patterns is a first pitch.

18. The method of claim 17, wherein the upper surface of the protrusion is deeper than a bottom of each of the first active patterns.

19. The method of claim 17, wherein a width of one of the first trenches in the second direction is in a range of 10 nm to 500 nm.

* * * * *